(12) United States Patent
Khoury et al.

(10) Patent No.: US 7,800,437 B2
(45) Date of Patent: Sep. 21, 2010

(54) CLOSED LOOP TIMING FEEDBACK FOR PWM SWITCHING AMPLIFIERS USING PREDICTIVE FEEDBACK COMPENSATION

(75) Inventors: John M. Khoury, Austin, TX (US); Richard G. Beale, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/454,534

(22) Filed: May 19, 2009

(65) Prior Publication Data
US 2009/0289709 A1    Nov. 26, 2009

Related U.S. Application Data

(60) Provisional application No. 61/128,412, filed on May 21, 2008.

(51) Int. Cl.
*H03F 3/38* (2006.01)
(52) U.S. Cl. .......................... 330/10; 330/251
(58) Field of Classification Search ............. 330/10, 330/251, 207 A
See application file for complete search history.

(56) References Cited

U.S. PATENT DOCUMENTS

| 5,198,785 A | 3/1993 | Jordan | 332/109 |
|---|---|---|---|
| 5,548,286 A | 8/1996 | Craven | 341/126 |
| 6,373,334 B1 | 4/2002 | Melanson | 330/10 |
| 6,498,531 B1 | 12/2002 | Ulrick et al. | 330/10 |

(Continued)

OTHER PUBLICATIONS

PCT/US2009/003083, "*International Search Report*,": dated Dec. 30, 2009.

(Continued)

*Primary Examiner*—Henry K Choe
(74) *Attorney, Agent, or Firm*—O'Keefe, Egan, Peterman & Enders, LLP

(57) ABSTRACT

Methods and systems are disclosed for closed loop feedback for pulse width modulated (PWM) switching amplifiers using predictive feedback compensation (PFC) for suppressing distortions caused by supply voltage variations and output amplitude switching non-idealities in pulse width modulated (PWM) switching amplifiers by pre-compensating the PWM input based upon the supply voltage or output pulse amplitude and using closed loop timing feedback. Output amplitude errors associated with previous PWM output signals are used to predict output amplitude errors expected for future PWM output signals. These predicted output amplitude errors are then used to adjust the pulse widths for the future PWM output signals. Timing differences between pulse widths for the uncompensated PWM input signal and the pre-compensated PWM signal are used as feedback to provide closed loop width adjustment.

24 Claims, 19 Drawing Sheets

U.S. PATENT DOCUMENTS

| | | | |
|---|---|---|---|
| 6,504,427 B2 | 1/2003 | Midya et al. | 330/10 |
| 6,563,378 B1 | 5/2003 | Kirn | 330/10 |
| 6,768,779 B1 | 7/2004 | Nielson | 375/297 |
| 6,922,100 B2 | 7/2005 | Midya et al. | 330/10 |
| 6,965,335 B1 | 11/2005 | Trotter et al. | 341/152 |
| 7,023,268 B1 | 4/2006 | Taylor et al. | 330/10 |
| 7,262,658 B2 | 8/2007 | Ramaswamy et al. | 330/251 |
| 7,286,009 B2 | 10/2007 | Andersen et al. | 330/10 |
| 7,570,037 B2 * | 8/2009 | Li et al. | 323/283 |
| 7,576,606 B2 * | 8/2009 | Andersen et al. | 330/10 |
| 7,629,840 B2 * | 12/2009 | Midya et al. | 330/10 |
| 2007/0152750 A1 | 7/2007 | Andersen et al. | 330/136 |
| 2007/0273348 A1 | 11/2007 | Isham | 323/282 |
| 2008/0084196 A1 | 4/2008 | Lacombe et al. | 323/282 |
| 2008/0122551 A1 | 5/2008 | Lee et al. | 332/109 |

OTHER PUBLICATIONS

Neilsen, Karsten, "*PEDEC—A Novel Pulse Referenced Control Method for High Quality Digital PWM Switching Power Application,*" pp. 200-207, Bang & Olufsen A/S, Struer, Denmark; Dept. of Applied Electronics, DTU, Denmark, 1998.

* cited by examiner

FIG. 8 | FIG. 8A | FIG. 8B

CLOSED LOOP TIMING FEEDBACK FOR PWM SWITCHING AMPLIFIERS USING PREDICTIVE FEEDBACK COMPENSATION

RELATED APPLICATIONS

This application claims priority to the following co-pending provisional application: Provisional Application Ser. No. 61/128,412, filed on May 21, 2008, and entitled "PREDICTIVE FEEDBACK EQUALIZATION FOR PWM SWITCHING AMPLIFIERS," which is hereby incorporated by reference in its entirety. The application is also related in subject matter to the following concurrently filed application Ser. No. 12/454,521, entitled "PREDICTIVE FEEDBACK COMPENSATION FOR PWM SWITCHING AMPLIFIERS" by Richard G. Beale et al., which is hereby incorporated by reference in its entirety.

TECHNICAL FIELD OF THE INVENTION

This invention relates to Class D amplifiers and, more particularly, to suppressing distortion and noise caused by power supply variations and output amplitude switching non-idealities in Class D amplifiers.

BACKGROUND

Performance of Class D switching amplifiers is susceptible to degradations from power supply variations and switching non-idealities. Power supply variations constitute a significant source of error since at full scale modulation the power supply rejection (PSR) is essentially 0 dB. While analog feedback techniques have been successfully employed with analog PWM (pulse width modulation) amplifiers to mitigate these degradations, applying feedback to digital PWM amplifiers is problematic because of incompatible domains and processing latencies.

One prior approach for mitigating these degradations employs open loop digital pre-compensation as depicted in FIG. 1A (Prior Art). The switching amplifier embodiment 100 receives digital PCM (pulse code modulated) signals and processes them with volume (VOL) control block 102. The output of the volume (VOL) control block 102 is provided to the PWM (pulse width modulated) controller 104. PWM controller (PWM) 104 outputs PWM signals to driver 106. The driver 106 provides the PWM output signals ($PWM_{OUT}$) for the Class D switching amplifier. To help adjust for errors in the PWM output signals ($PWM_{OUT}$) due to voltage supply variations, this prior solution feeds the supply voltage (Vp) for the driver 106 to an analog-to-digital converter (ADC) 108 and then to filter 110 to provide a feedback signal to the volume (VOL) control block. The gain applied by the volume (VOL) control block 102 to the incoming PCM signals is then adjusted based upon the feedback signal received from the filter 110. This prior approach, therefore, attempts to compensate for amplitude errors in the output signals caused by variations in the voltage supply (Vp) through voltage supply (Vp) feedback signals that adjust the amplitude of the incoming PCM signals.

Another prior approach employs closed loop feedback of the PWM pulse area as depicted in FIG. 1B (Prior Art). The switching amplifier embodiment 150 includes a PWM controller (PWM) 104 that receives the PCM signals and outputs PWM signals to a pulse edge error correction (PEDEC) block 152. The output signals from PEDEC block 152, which are edge corrected PWM signals, are provided to driver 106. The driver 106 provides the PWM output signals ($PWM_{OUT}$) for the Class D switching amplifier. To help adjust for errors in PWM output signals ($PWM_{OUT}$), this prior solution sends the PWM output signal ($PWM_{OUT}$) as a feedback signal to an error processing block 154. The error processing block 154 also receives the PWM input signals from PWM controller 104 as reference signals. The error processing block 154 then outputs edge error correction signals to the PEDEC block 152. The PEDEC block 152 uses these edge error correction signals to adjust the edges of the PWM input signals so that the PWM output signals 156 from the PEDEC block 152 are edge corrected PWM signals. This prior approach attempts to compensate for PWM pulse area errors in the output signals by comparing the pulse area of the PWM output signal with that of the PWM input signal and then adjusting the edges of the PWM signals to compensate for the area differences.

While these approaches have been employed to mitigate non-ideal effects of digital PWM amplifiers, solutions are lacking that improve the intrinsic power supply rejection, distortion, and damping performance of open loop switching amplifiers.

SUMMARY OF THE INVENTION

Methods and systems are disclosed for closed loop feedback for pulse width modulated (PWM) switching amplifiers using predictive feedback compensation (PFC) for suppressing distortions caused by supply voltage variations and output amplitude switching non-idealities in pulse width modulated (PWM) switching amplifiers by pre-compensating the PWM input based upon the supply voltage or output pulse amplitude and using closed loop timing feedback. Output amplitude errors associated with previous PWM output signals are used to predict output amplitude errors expected for future PWM output signals. These predicted output amplitude errors are then used to adjust the pulse widths for the future PWM output signals. Timing differences between pulse widths for the uncompensated PWM input signal and the pre-compensated PWM signal are used as feedback to provide closed loop width adjustment. As described below, other features and variations can be implemented and related methods and systems can be utilized, as well.

In one embodiment, a method is disclosed for pre-compensation timing feedback in switching amplifiers using predictive feedback compensation. This method includes receiving a pulse width modulated (PWM) input signal having an input pulse width, predicting an output pulse amplitude error for the PWM input signal based on a prior PWM output signal, pre-compensating the input pulse width for the PWM input signal with a width adjustment to produce a pre-compensated PWM signal having a pre-compensated pulse width such that the predicted output pulse amplitude error weighted by a pulse width is forced by closed loop feedback to equal a timing difference between the pre-compensated pulse width and the input pulse width weighted by an output pulse amplitude such that the width adjustment is thereby based upon a ratio of the predicted output pulse amplitude error to the output pulse amplitude weighted by the pulse width, and outputting a PWM output signal through a switching amplifier where the PWM output signal has a pulse width based upon the pre-compensated PWM signal. In a further embodiment, the determining step includes determining the timing difference by comparing a rising edge for the pre-compensated PWM signal to a reference edge based on the PWM input signal and by comparing a falling edge for the pre-compensated PWM input signal to a reference edge based on the PWM input signal. Still further, the method can include using a rising reference edge based on the PWM input signal for the rising edge comparison and using a falling reference edge based on the PWM input signal for the falling edge comparison. In addition, the method can include generating a first timing feedback signal to reduce a time-of-transition or a second timing feedback signal to increase the time-of-transition for the rising edge of the pre-compensated PWM signal based upon the timing difference, and generating a third timing feedback signal to reduce a time-of-transition or a fourth timing feedback signal to increase the time-of-transition of the falling edge for the pre-compensated PWM signal based upon the timing difference.

In another embodiment, the pre-compensating step can include weighting the predicted output pulse amplitude error by the input pulse width for the PWM input signal and weighting the timing difference between the pre-compensated pulse width and the input pulse width by the output pulse amplitude total value such that the width adjustment is based upon a ratio of the predicted output pulse amplitude error to the output pulse amplitude total value weighted by the input pulse width. Alternatively, the pre-compensating step can include weighting the predicted output pulse amplitude error by the pre-compensated pulse width and weighting the timing difference between the pre-compensated pulse width and the input pulse width by the output pulse amplitude desired value such that the width adjustment is based upon a ratio of the predicted output pulse amplitude error to the output pulse amplitude desired value weighted by the pre-compensated signal pulse width.

In still further embodiments, the predicting step can include measuring a varying or alternating current (AC) component of a supply voltage to predict the output pulse amplitude error for the PWM input signal based on a prior PWM output signal. The predicting step can also include measuring a varying or alternating current (AC) component of an output pulse amplitude for the PWM output signal to predict the output pulse amplitude error for the PWM input signal based on a prior PWM output signal. The receiving step can include receiving two PWM input signals, such that signal information resides in a difference between the two signals, wherein the outputting step comprises outputting two PWM output signals, and wherein the pre-compensating step comprises adjusting pulse widths for each of the two PWM input signals. Still further, the method can include predicting an output pulse amplitude error associated with a single prior PWM output signal or predicting an output pulse amplitude error associated with a plurality of prior PWM output signals.

In another embodiment, a digital switching amplifier is disclosed having pre-compensation timing feedback for predictive feedback compensation. The digital switching amplifier can include amplitude error prediction circuitry, width adjustment circuitry and switching amplifier driver circuitry. The amplitude error prediction circuitry can be configured to sense a voltage representing the output pulse amplitude for a PWM output signal, to determine a predicted output pulse amplitude error for a PWM input signal using the sensed voltage, and to output a predictive error correction signal proportional to a ratio of the predicted output pulse amplitude error to an output pulse amplitude weighted by a pulse width. The width adjustment circuitry can be coupled to receive the predictive error correction signal and a PWM input signal having an input pulse width and can be configured to output a pre-compensated PWM signal having a pre-compensated pulse width based upon a width adjustment such that the predicted output pulse amplitude error weighted by a pulse width is forced by closed loop feedback to equal a timing difference between the pre-compensated PWM pulse width and the input pulse width weighted by an output pulse amplitude such that the width adjustment is thereby based upon a ratio of the predicted output pulse amplitude error to the output pulse amplitude weighted by the pulse width. And the switching amplifier driver circuitry can be configured to receive the pre-compensated PWM signal and to drive a PWM output signal. In a further embodiment, the width adjustment circuitry can include timing comparison circuitry configured to generate timing feedback signals based upon comparisons between the PWM input signal and the pre-compensated PWM signal, summation circuitry configured to combine the predictive error correction signal with the timing feedback signals and to provide a correction signal, and variable width circuitry configured to receive the correction signal and to output the pre-compensated PWM signal.

In further embodiments, the timing comparison circuitry can include edge detection circuitry configured to compare a pre-compensated pulse width for the pre-compensated PWM signal to a reference pulse width based on the PWM input signal to determine a width adjustment timing relationship between the pre-compensated PWM signal and the PWM input signal and to provide timing feedback signals based upon the width adjustment timing relationship. Still further, the edge detection circuitry can include rising edge detection circuitry configured to compare rising edges for the pre-compensated PWM signal to reference edges based on the PWM input signal and falling edge detection circuitry configured to compare falling edges for the pre-compensated PWM signal to reference edges based on the PWM input signal. In addition, the rising edge detection circuitry can be configured to use rising reference edges based on the PWM input signal for the rising edge comparison, and the falling edge detection circuitry can be configured to use falling reference edges based on the PWM input signal for the falling edge comparison. Further, the rising edge detection circuitry can be further configured to generate a first timing feedback signal to reduce a time-of-transition or a second timing feedback signal to increase the time-of-transition for the rising edge of the pre-compensated PWM signal based upon the timing difference, and to generate a third timing feedback signal to reduce a time-of-transition or a fourth timing feedback signal to increase the time-of-transition of the falling edge for the pre-compensated PWM signal based upon the timing difference. In one additional embodiment, the timing feedback signals can be weighted by an output pulse amplitude total value, and the width adjustment can be based upon a ratio of the predicted output pulse amplitude error to the output pulse amplitude total value weighted by the input pulse width for the PWM input signal. Alternatively, the timing feedback signals can be weighted by an output pulse amplitude desired value, and the width adjustment can be based upon a ratio of the predicted output pulse amplitude error to the output pulse amplitude desired value weighted by the pre-compensated pulse width for the pre-compensated PWM signal.

In a further embodiment, the amplitude error prediction circuitry can be configured to sense a varying or alternating current (AC) component of a supply voltage to predict the output pulse amplitude error for the PWM input signal based on a prior PWM output signal. The amplitude error prediction circuitry can also be configured to sense a varying or alternating current (AC) component of an output pulse amplitude for the PWM output signal to predict the output pulse amplitude error for the PWM input signal based on a prior PWM output signal. Still further, the PWM input signals can include two PWM input signals, such that signal information resides in a difference between the two signals, the PWM output signals comprise two PWM output signals, and the width adjustment circuitry can be configured to adjust pulse widths for the two PWM input signals. Still further, the amplitude error prediction circuitry can be configured to predict an output pulse amplitude error associated with a single prior PWM output signal, or the amplitude error prediction circuitry can be configured to predict an output pulse amplitude error associated with a plurality of prior PWM output signals.

As described below, other features and variations can be implemented and related methods and systems can be utilized, as well.

DESCRIPTION OF THE DRAWINGS

It is noted that the appended drawings illustrate only example embodiments of the invention and are, therefore, not to be considered limiting of its scope, for the invention may admit to other equally effective embodiments.

DETAILED DESCRIPTION OF THE INVENTION

Methods and systems are disclosed for suppressing distortion and noise caused by supply voltage variations and output amplitude switching non-idealities in PWM (pulse width modulated) switching amplifiers, such as Class D digital audio amplifiers, through the use of predictive feedback compensation.

As described herein, predictive feedback compensation (PFC) provides an approach that uses output amplitude error information from the previous pulse frame(s) to predict how much to adjust the current pulse width to correctly compensate for gain non-idealities in the switching amplifier caused by power supply voltage variations (and optionally other output amplitude variations caused by switching non-idealities like variations in $r_{dson}$, which represents the resistance between the drain and source of the output driver transistors). A performance benefit of the PFC approaches described herein is that the pre-compensating signal can be used to correct non-idealities frame by frame, thereby helping to prevent the output signal from becoming corrupted in the first place while still not degrading the audio transient response of the open loop amplifier. Because power supply ripple corrupts the in-band output of a switching amplifier non-linearly in a mixing, multiplicative fashion, it is beneficial to eliminate or attenuate the inter-modulation products in the forward path. Overall performance may also be improved by adding a feedback loop to the PFC circuitry.

Figure 1A:
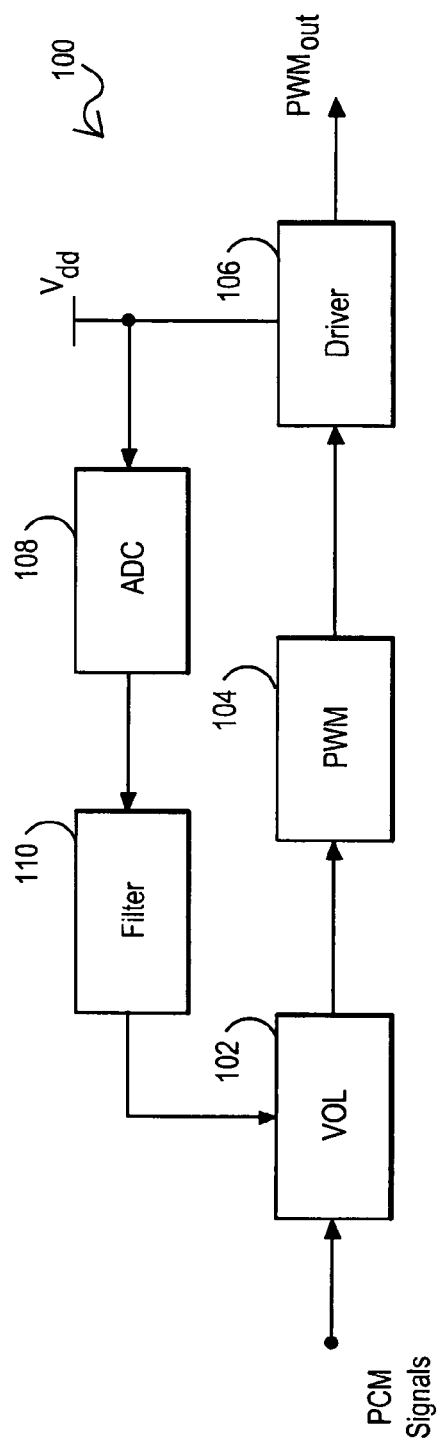
FIG. 1A (prior art) is a block diagram for a prior solution that uses a supply voltage prediction signal to adjust the gain applied to PCM (pulse code modulated) digital input signals.
Figure 1B:
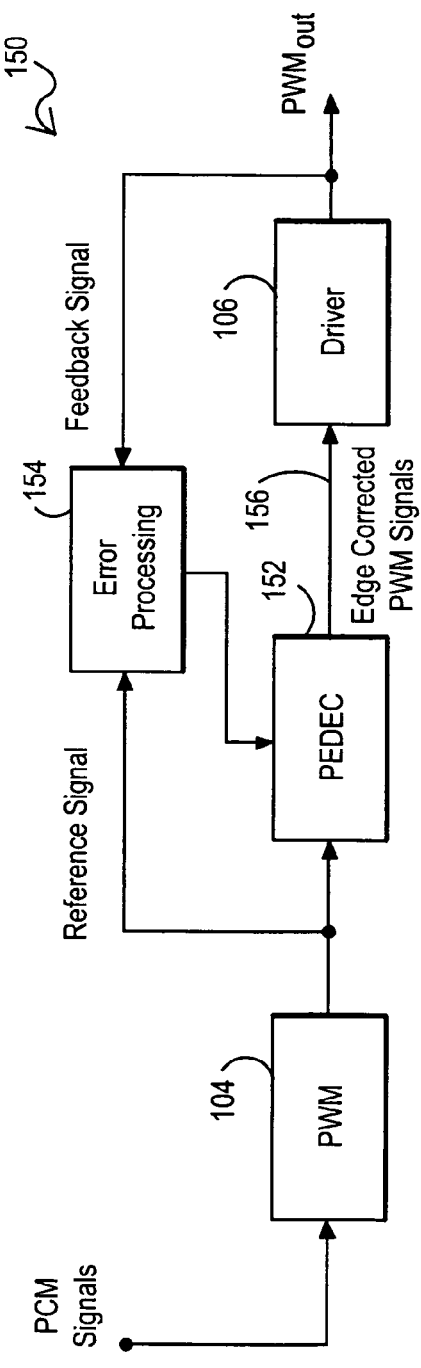
FIG. 1B (prior art) is a block diagram for a prior solution that uses a feedback signal based upon area comparison of PWM input/output signals to adjust the edges of PWM signals.
Figure 2A:
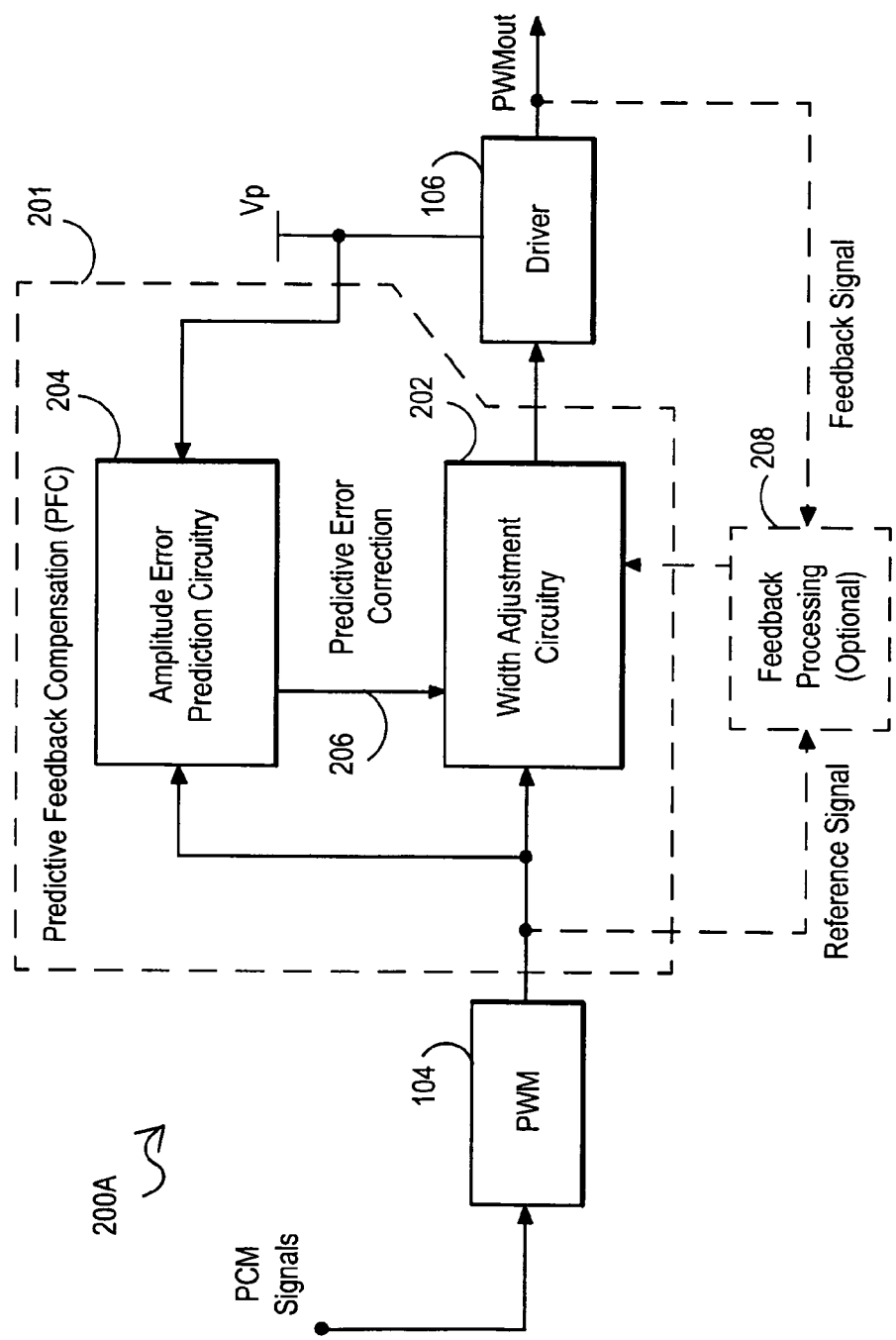
FIGS. 2A, 2B, 2C and 2D are block diagrams for embodiments of switching amplifiers including predictive feedback compensation (PFC) circuitry for width adjustment.
Figure 2B:
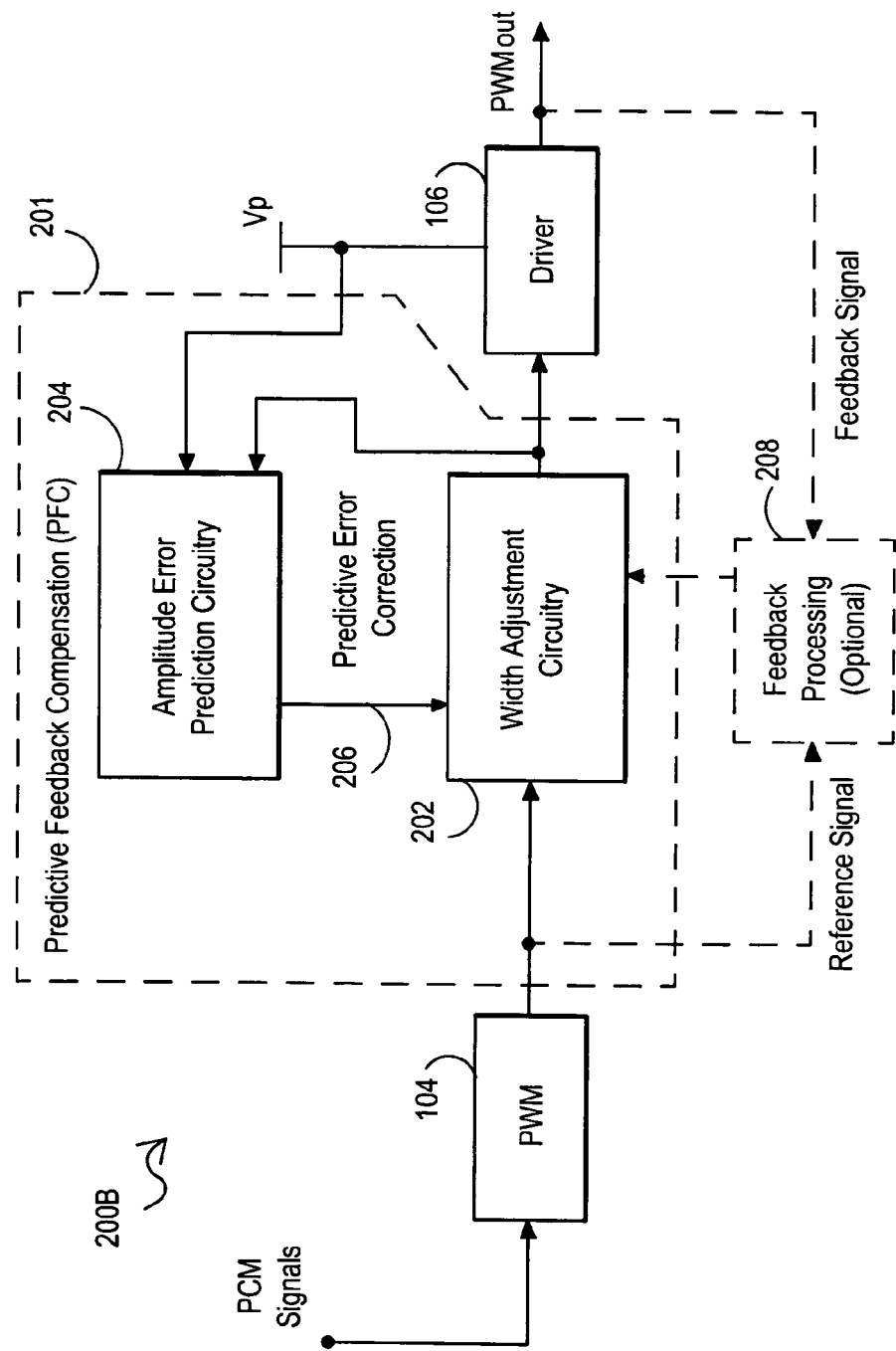
Figure 2C:
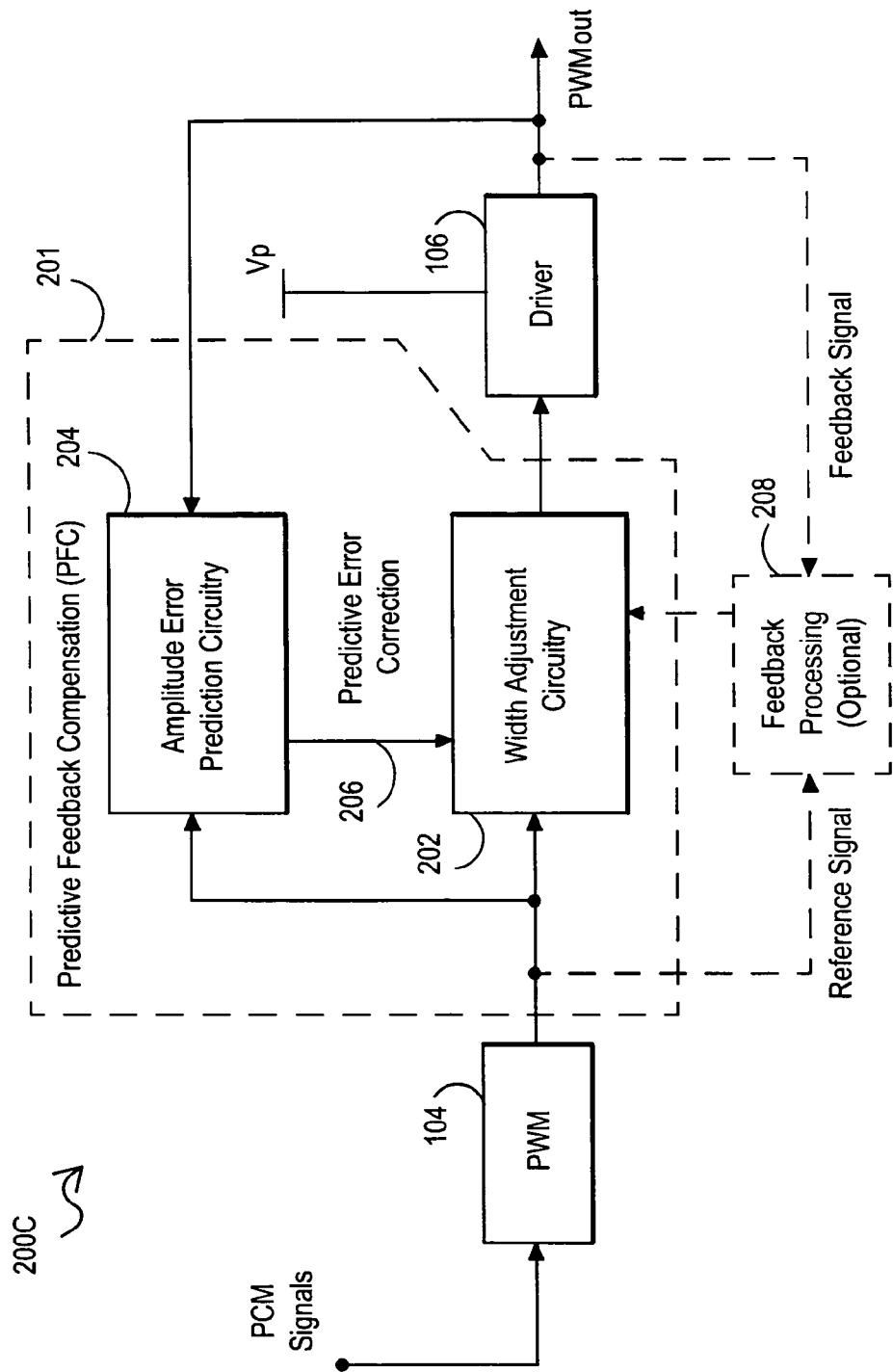

FIGS. 2A, 2B, 2C and 2D are block diagrams for embodiments of switching amplifiers including predictive feedback compensation (PFC) circuitry for adjusting the pulse width to mitigate PWM output pulse amplitude errors. In each of these embodiments, width adjustment circuitry 202 receives an uncompensated PWM input signal and uses a predictive error correction signal 206 to produce a PWM input signal to the output driver having a pre-compensated pulse width that has been adjusted for predicted amplitude errors in the PWM output signals at the output driver. FIG. 2A uses the uncompensated PWM input signal (input to the width adjustment circuitry) and a predicted supply voltage error to provide the predictive error correction signal 206. FIG. 2B uses the pre-compensated PWM signal (output of the width adjustment circuitry) and a predicted supply voltage error to provide the predictive error correction signal 206. FIG. 2C uses the uncompensated PWM input signal and a predicted PWM output pulse amplitude to provide the predictive error correction signal 206. And FIG. 2D uses the pre-compensated PWM signal and a predicted PWM output pulse amplitude to provide the predictive error correction signal 206. Each of these embodiments is now discussed in more detail.

FIG. 2A is a block diagram for a switching amplifier 200A including predictive feedback compensation (PFC) for pulse width adjustment through the detection and prediction of amplitude errors using the uncompensated PWM input signal and a predicted supply voltage to provide the predictive error correction signal 206. As depicted, audio PCM input signals are received by a PWM controller 104, and the output of PWM controller 104 is provided to width adjustment circuitry 202. Width adjustment circuitry 202 in turn provides width adjusted PWM signals to driver 106. Driver 106 then produces the PWM output signals, for example, in the form of B-pulse (B) output signals and D-pulse (D) output signals for a Class D digital audio PWM switching amplifier.

The driver 106 is also coupled to receive power from supply voltage (Vp). The supply voltage (Vp), however, can have variations that lead to amplitude errors in the PWM output signals, and these errors translate into distortion and noise in the audio output heard by a user for Class D digital audio switching amplifiers. To compensate for these amplitude errors, amplitude error prediction circuitry 204 generates a predictive error correction signal 206 and provides it to the width adjustment circuitry 202.

The amplitude error prediction circuitry 204 receives the supply voltage (Vp) and outputs the predictive error correction signal 206. The amplitude error prediction circuitry 204 also receives and utilizes the PWM input signals from PWM controller 104 for its error processing. The width adjustment circuitry 202 and the amplitude error prediction circuitry 204 form the predictive feedback compensation (PFC) 201. If desired, optional feedback can also be provided. For example, a feedback signal from the PWM output signal ($PWM_{OUT}$) and a reference signal from the PWM input can be provided to feedback processing block 208. The feedback processing block 208 can compare the PWM input and PWM output signals and then provide a feedback error correction signal to the edge correction circuitry within the PFC 201. As such, the PFC approach described herein can be used in conjunction with feedback systems.

FIG. 2B is a block diagram for a switching amplifier 200B including predictive feedback compensation for pulse width adjustment through the detection and prediction of amplitude errors using the pre-compensated PWM signal and a predicted supply voltage to provide the predictive error correction signal 206. In most respects, the embodiment 200B of FIG. 2B is similar to the embodiment 200A of FIG. 2A. The difference between these two embodiments is that for embodiment 200B of FIG. 2B, the amplitude error prediction circuitry 204 receives the pre-compensated PWM signal that is provided as the output of the width adjustment circuitry 202, rather than receiving the uncompensated PWM input signal from the PWM controller 104, as is done for embodiment 200A in FIG. 2A.

FIG. 2C is a block diagram for a switching amplifier 200C including predictive feedback compensation for pulse width adjustment through the detection and prediction of amplitude errors using the uncompensated PWM input signal and a predicted PWM output amplitude error to provide the predictive error correction signal 206. In most respects, the embodiment 200C of FIG. 2C is similar to the embodiment 200A of FIG. 2A. The difference between these two embodiments is that for embodiment 200C of FIG. 2C, the amplitude error prediction circuitry 204 receives the pulse amplitude of the PWM output signal from the output of the driver circuitry 106, rather than receiving the supply voltage (Vp), as is done for embodiment 200A in FIG. 2A. It is further noted that amplitude error prediction circuitry 204 can include sample-and-hold circuitry coupled to receive the pulse amplitude of the PWM output signal.

Figure 2D:
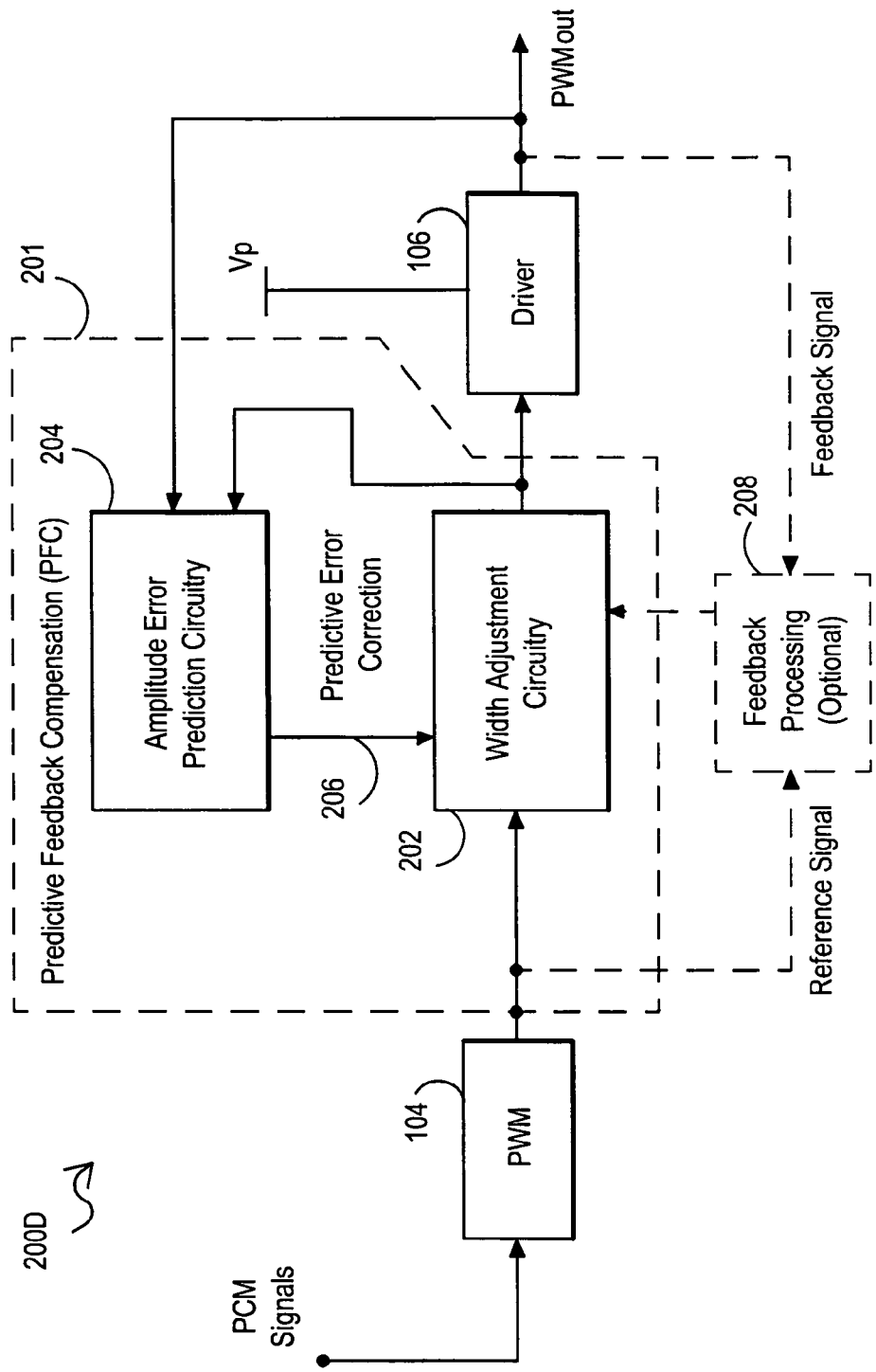

FIG. 2D is a block diagram for a switching amplifier 200D including predictive feedback compensation for pulse width adjustment through the detection and prediction of amplitude errors using the pre-compensated PWM signal and a predicted PWM output amplitude error to provide the predictive error correction signal 206. In most respects, the embodiment 200D of FIG. 2D is similar to the embodiment 200A of FIG. 2A. One difference between these two embodiments is that for embodiment 200D of FIG. 2D, the amplitude error prediction circuitry 204 receives the pre-compensated PWM signal that is provided as the output of the width adjustment circuitry 202, rather than receiving the uncompensated PWM input signal from the PWM controller 104, as is done for embodiment 200A in FIG. 2A. The other difference between these two embodiments is that for embodiment 200D of FIG. 2D, the amplitude error prediction circuitry 204 receives the pulse amplitude of the PWM output signal from the output of the driver circuitry 106, rather than receiving the supply voltage (Vp), as is done for embodiment 200A in FIG. 2A. It is further noted that amplitude error prediction circuitry 204 can include sample-and-hold circuitry coupled to receive the pulse amplitude of the PWM output signal.

FIGS. 2A, 2B, 2C and 2D provide for compensation of the pulse width based upon output amplitude errors through the detection and measurement of voltage supply errors or direct measurement of the amplitude of output pulse itself. As described further with respect to FIGS. 10A, 10B and 10C below, robustness of the width adjustment circuitry can be increased using a closed loop system. For example, for embodiments 200B in FIG. 2B and 200D in FIG. 2D, which use the width-adjusted, pre-compensated PWM signals output by the width adjustment circuitry 202 to provide an input to the amplitude error prediction circuitry 204, stability can be realized by using a closed width adjustment loop, or similar circuit with servo feedback, examples of which are discussed with respect to FIGS. 10A, 10B and 10C below. If the pre-compensated PWM signals are used with an open loop adjustment circuit rather than a closed loop adjustment circuit, the output width will tend to ratchet to the maximum or minimum adjustment depending upon the sign of the predicted error correction signal.

Embodiments for PWM switching amplifiers with PFC circuitry will now be discussed below with respect to FIGS. 3, 4, 5, 6A, 6B, 7, 8A, 8B, 9A, 9B, 10A, 10B and 10C.

PFC (Predictive Feedback Compensation) Approach

Figure 3:
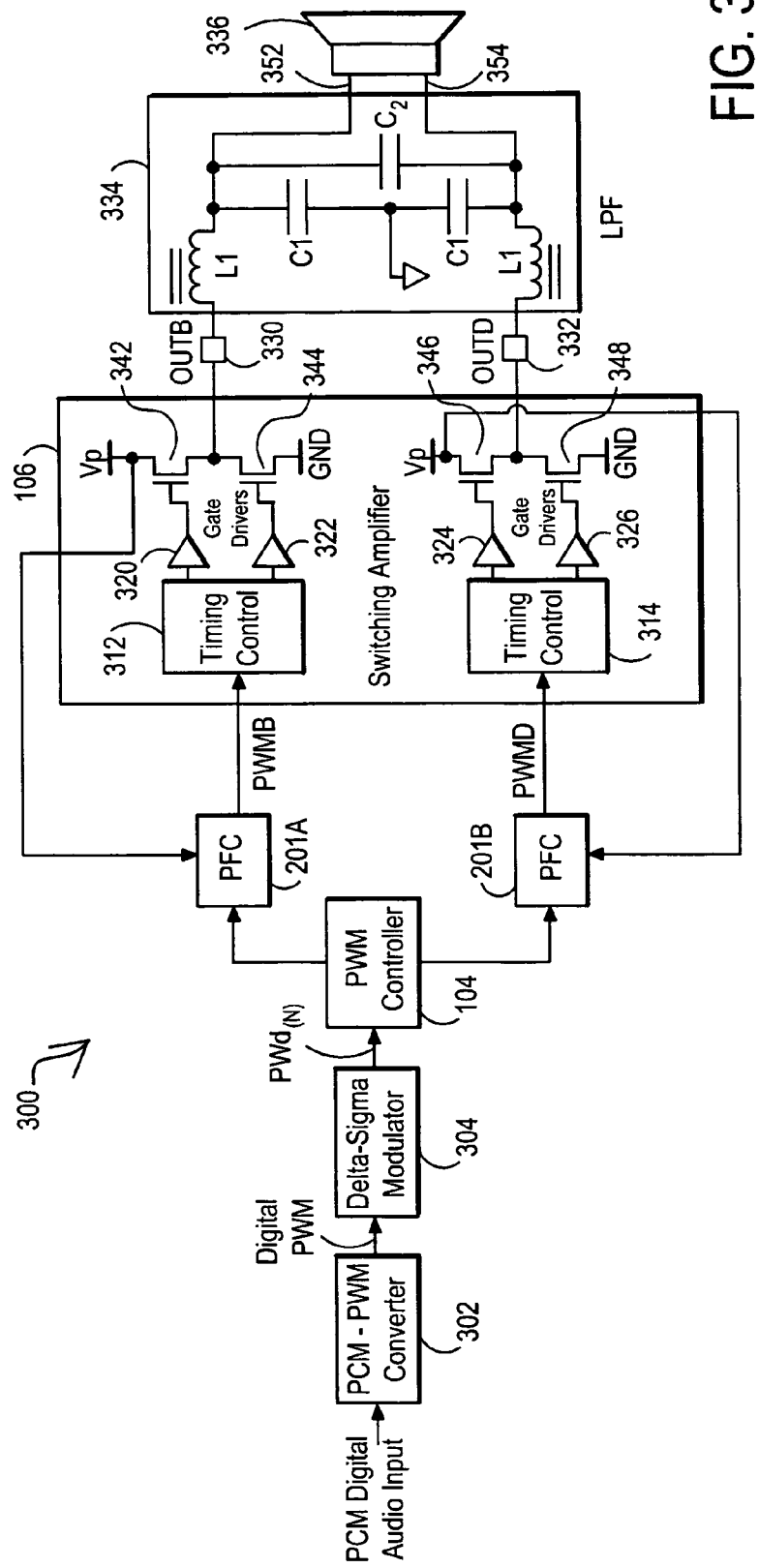
FIG. 3 is a detailed block diagram for a switching amplifier including predictive feedback compensation (PFC) circuitry.

FIG. 3 is a detailed block diagram for a Class D audio switching amplifier embodiment with the addition of PFC (predictive feedback compensation) blocks 201A and 201B to address output pulse amplitude errors caused by variations in the voltage supply as described herein. As depicted, PFC 201A and PFC 201B are positioned between PWM controller 104 and switching amplifier 106. PFC 201A and PFC 201B achieve the advantageous results described herein.

As depicted in this example, PCM digital audio input signals are received by a PCM-to-PWM converter 302, which outputs digital PWM signals to a delta-sigma modulator 304. The output of delta-sigma modulator 304 is a digital pulse width value ($PWd_{(N)}$) representing one PWM output frame that is sent to the PWM controller 104, which in turn produce PWM input signals for PFC 201A and PFC 201B, respectively. PFC 201A and PFC 201B produce the B and D PWM signals (PWMB, PWMD) that are provided, respectively, to B-pulse timing control circuitry 312 and D-pulse timing control circuitry 314 within the switching amplifier 106.

The switching amplifier circuitry 106 takes the B/D PWM signals (PWMB, PWMD) and drives a desired load, such as a speaker 336. The B-pulse timing control circuitry 312 produces output signals for gate drivers 320 and 322. The gate drivers 320 and 322 provide control signals to the gates of PMOS drive transistor 342 and NMOS drive transistor 344, respectively, which in turn produce the B-pulse output signal applied to the B-signal output pin (OUTB) 330. The D-pulse timing control circuitry 314 produces output signals for gate drivers 324 and 326. The gate drivers 324 and 326 provide control signals to the gates of PMOS drive transistor 346 and NMOS drive transistor 348, respectively, which in turn produce the D-pulse output signal applied to the D-signal output pin (OUTD) 332.

A passive LPF (low pass filter) 334 receives the B and D output signals and provides output signals on nodes 352 and 354 to drive a speaker 336. The passive LPF 334 can include inductors and capacitors to provide reconstruction filtering, such as inductors (L1) connected in the signal paths between output pins 330 and 332 and output nodes 352 and 354, capacitors (C1) connected between the output nodes 352 and 354 and ground, and a capacitor (C2) connected between the two output nodes 352 and 354.

To produce a predictive error correction signal associated with the supply voltage for the drive circuitry, PFC 201A is connected to receive the supply voltage (Vp) for the output drive transistors 342 and 344. As depicted, PMOS drive transistor 342 has its source connected to the supply voltage (Vp) and its drain connected to the output node that connects to pin 330. NMOS drive transistor 344 has its drain connected to the output node that connects to pin 330 and its source connected to ground (GND). PFC 201A is also configured to receive and utilize the B-pulse output signal (PWMB) from the PWM controller 104. PFC 201A operates to adjust the pulse width of the PWMB output signals to account for errors caused by variations in the supply voltage (Vp), as described further below.

Similarly, to produce a predictive error correction signal associated with the supply voltage for the drive circuitry, PFC 201B is connected to receive the supply voltage (Vp) for the output drive transistors 346 and 348. As depicted, PMOS drive transistor 346 has its source connected to the supply voltage (Vp) and its drain connected to the output node that connects to pin 332. NMOS drive transistor 348 has its drain connected to the output node that connects to pin 332 and its source connected to ground (GND). PFC 201B is also configured to receive and use the D-pulse output signal (PWMD) from PWM controller 104. PFC 201B operates to adjust the pulse width of the PWMD output signals to account for errors caused by variations in the supply voltage (Vp), as described further below. It is further noted that the supply voltage (Vp) for the B-pulse output signal (PWMB) and the D-pulse output signal (PWMD) could be separate signals or be the same signal, as desired.

In operation of the open loop digital delta-sigma (ΔΣ) Class D switching amplifier and passive LPF depicted in FIG. 3, each PCM digital input sample is first converted to a digital PWM number representing the desired output pulse width. The resulting high resolution multi-bit digital PWM signal is then noise shaped and encoded by the PWM controller 104 into signal(s) for controlling the output state of the switching amplifier. For single-ended configurations, this will be a single PWM signal whereas for BTL (bridge-tied load) configurations as shown in FIG. 3, this can be a pair of PWM signals (PWMB and PWMD), one for each side of the bridge. The width of the switched output pulse at each output pin 330 and 332 is determined by the width of the input PWM control signal, and the amplitude of the switched output pulse is determined by the switching amplifier supply voltage level (Vp). Variations in the supply voltage (Vp) and in edge transitions introduce errors in the filtered output signals which generally correlate to a continuous integration of the area under the output pulse signals. It is the amplitude errors caused by variations in the supply voltage (Vp) that PFC 201A and PFC 201B address.

It is noted that PFC 201A and PFC 201B receive the supply voltage (Vp) in embodiment 300 of FIG. 3. As with the embodiments in FIGS. 2C and 2D, the PFC 201A and the PFC 201B could instead receive the pulse amplitude of the PWM output signals applied to pins 330 and 332. In addition, the PFC 201A and the PFC 201B could receive both the supply voltage ($V_p$) and the pulse amplitude of the PWM output signals, if desired.

Figure 4:
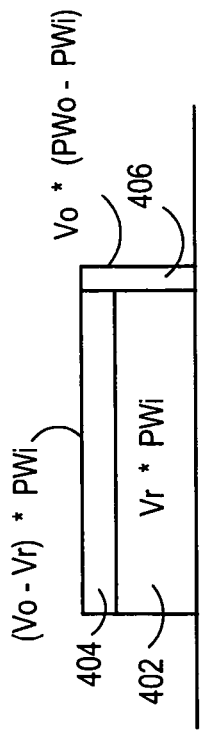
FIG. 4 is a signal diagram showing a deconstructed pulse with pulse errors.

FIG. 4 is a signal diagram showing pulse area errors. In particular, FIG. 4 shows a deconstruction of these errors for a single pulse frame into a time-based error component 406 and a voltage-based (or amplitude-based) error component 404, for a desired or reference pulse area 402. As noted above, the amplitude of the output pulse will correlate to the voltage supply received by the output driver. Looking back to FIG. 4, the amplitude for the desired or reference pulse is represented by the term $V_r$, and the pulse width for the reference pulse is represented by the term $PW_i$. The output amplitude for the pulse is represented by the term $V_o$, and the output width is represented by the term $PW_o$. Using these designations, the total error in the output pulse area can represented by an amplitude (voltage-based) error ($E_V=(V_o-V_r)*PW_i$) plus a width (time-based) error ($E_W=(PW_o-PW_i)*V_o$), according to the following equation:

$$E_{TOTAL}=E_V+E_W=[(V_o-V_r)*PW_i]+(PW_o-PW_i)$$
$$*V_o=V_o*PW_o-V_r*PW_i$$

The goal of the predictive feedback compensation described herein is to generate an output pulse having the same area as the desired or reference pulse area ($V_r*PW_i$) by correcting for the amplitude (voltage-based) error represented by area 404.

If the total error ($E_{TOTAL}$) is set to zero, then $V_o*PW_o=V_r*PW_i$. The precompensated pulse width ($PW_o$) is the ideal pulse width ($PW_i$) plus the pulse width correction ($PW_c$), resulting in the representation:

$$V_o*(PW_i+PW_c)=V_r*PW_i.$$

Solving for $PW_c$ in terms of $PW_i$ (per examples of FIGS. 2A and 2C) results in the following expression:

$$PW_c=(PW_i*V_r/V_o)-PW_i=PW_i*[(V_r-V_o)/V_o].$$

It is noted that the desired or reference pulse amplitude $V_r$ in most practical applications will typically be the DC component of the output amplitude $V_o$, and the ripple (or AC) component ($V_n$) will typically be the difference between the output amplitude absolute voltage ($V_o$) and this desired or reference pulse amplitude ($V_r$) (i.e., $V_n=V_o-V_r$). The output amplitude absolute voltage ($V_o$) can also be estimated using the supply absolute voltage ($V_p$) (i.e., $V_p=V_o=V_n+V_r$). Substituting and rearranging terms results in a feedforward algorithm:

$$PW_c=-PW_i*V_n/(V_n+V_r)$$

$$PW_c=-PW_i*V_n/V_p.$$

Thus, the effects of power supply ripple can be eliminated by pre-compensating the input pulse width ($PW_i$) with a counteracting adjustment ($PW_c$) proportional to input pulse width ($PW_i$) times the ratio of ripple voltage ($V_n$) to supply voltage ($V_p=V_n+V_r$). For this solution that follows the examples of FIGS. 2B and 2D, the ripple voltage ($V_n$) represents the predicted output pulse amplitude error for the PWM input signal based upon a prior PWM output signal. And the supply voltage ($V_p=V_n+V_r$) represents an output pulse amplitude in the form of an output pulse amplitude total value. In this way, the pre-compensating operation pre-compensates the input pulse width for the PWM input signal with an adjustment based upon a ratio of the predicted output pulse amplitude error ($V_n$) to the predicted output pulse amplitude total value ($V_p$) weighted by the input pulse width ($PW_i$) for the PWM input signal to produce the pre-compensated pulse width for the PWM input signal.

Alternatively, the counteracting adjustment ($PW_c$) can be solved in terms of the corrected pulse width output $PW_o$, wherein $PW_o=PW_i+PW_c$ (per examples of FIGS. 2B and 2D). The resulting equation is:

$$V_o*PW_o=V_r*(PW_o-PW_c).$$

Again, substituting and rearranging results in a feedback algorithm:

$$PW_c=PW_o-(PW_o*V_o/V_r), \text{ or}$$

$$PW_c=PW_o*[1-(V_o/V_r)], \text{ or}$$

$$PW_c=PW_o*[(V_r-V_o)/V_r], \text{ or}$$

$$PW_c=-PW_o*(V_n)/(V_r).$$

Thus, alternatively, the effects of power supply ripple can be eliminated by pre-compensating the input pulse width ($PW_i$) with a counteracting adjustment ($PW_c$) proportional to corrected pulse width ($PW_o$) times the ratio of ripple voltage ($V_n$) to the reference (or desired) voltage ($V_r$). For this alternative solution that follows the examples of FIGS. 2A and 2C, the ripple voltage ($V_n$) represents the predicted output pulse amplitude error for the PWM input signal based upon a prior PWM output signal. And the reference or desired voltage ($V_r$) represents an output pulse amplitude in the form of an output pulse amplitude desired value. In this way, the pre-compensating operation pre-compensates the input pulse width ($PW_i$) for the PWM input signal with an adjustment based upon a ratio of the predicted output pulse amplitude error ($V_n$) to the output pulse amplitude desired value ($V_r$) weighted by a pre-compensated pulse width ($PW_o$) for a prior PWM input signal to produce the width adjustment ($PW_c$) for the PWM input signal.

The two alternative pre-compensating techniques set forth above can be represented more generally using EQUATION 1 below. Using EQUATION 1, pre-compensating operation pre-compensates the input pulse width ($PW_i$) for the PWM input signal with a width adjustment ($PW_c$) based upon a ratio of the predicted output pulse amplitude error ($V_n$) to an output pulse amplitude ($V=V_p$ or $V_r$) weighted by a pulse width ($PW=PW_i$ or $PW_o$). In other words, the equation related to FIGS. 2A and 2C, which is:

$$PW_c = -PW_i * V_n / V_p \quad \text{[EQUATION 2A]}$$

and the equation related to FIGS. 2B and 2D, which is:

$$PW_c = -PW_o * V_n / V_r \quad \text{[EQUATION 2B]}$$

can be expressed more generally as the following:

$$PW_c = -PW * V_n / V \quad \text{[EQUATION 1]}$$

where PW is a pulse width for a PWM signal and V is a related output pulse amplitude. For EQUATION 2A above, PW is the input pulse width ($PW_i$) for the prior PWM output signal, and V is the related output pulse amplitude total value ($V_p$). And for EQUATION 2B above, PW is the pre-compensated pulse width ($PW_o$) for a prior PWM input signal, and V is the related output pulse amplitude desired value ($V_r$).

It is further noted that the predicted output pulse amplitude error ($V_n$) for EQUATION 1, EQUATION 2A and EQUATION 2B can be predicted using the supply voltage driving the output switching amplifiers and/or using the amplitude of the output PWM signal itself. FIGS. 2A and 2B provide example embodiments where the supply voltage is used for the amplitude error prediction circuitry. As such, measuring a varying or alternating current (AC) component of the supply voltage is used to predict the output pulse amplitude error ($V_n$) for the PWM input signal based on a prior PWM output signal. FIGS. 2C and 2D provide example embodiments where the output PWM signal is used for the amplitude error prediction circuitry. As such, measuring a varying or alternating current (AC) component of the output pulse amplitude for the PWM output signal is used to predict the output pulse amplitude error ($V_n$) for the PWM input signal based on a prior PWM output signal.

Compensating Circuit Structure—Negative Edge Delay Cell

Figure 5:
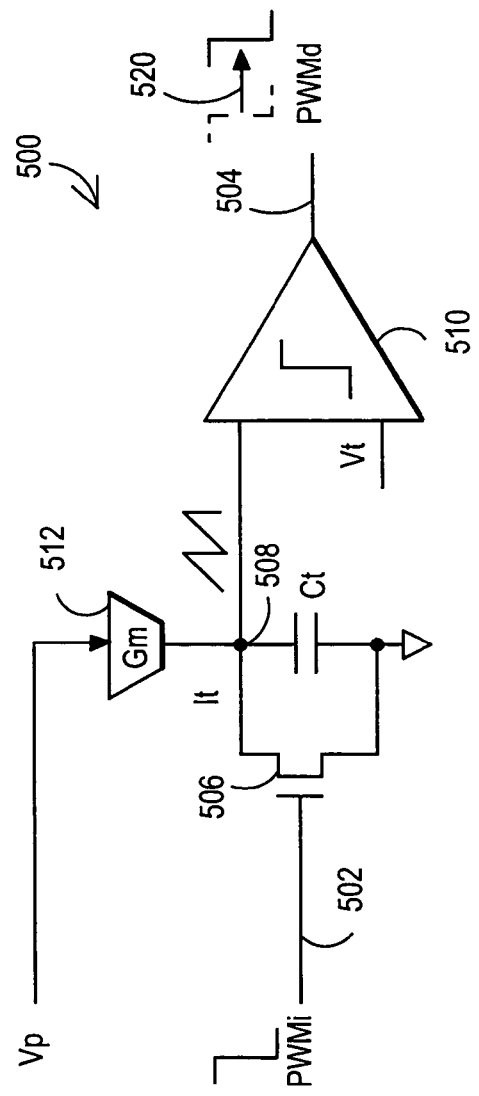
FIG. 5 is a circuit diagram for a negative edge delay cell that can be used to provide predictive feedback compensation.

FIG. 5 is a circuit diagram for a negative edge delay cell that can be used to implement width adjustment circuitry for predictive feedback compensation. This circuit structure 500 implements delay for a falling edge with the voltage ratio relationship set forth in the equations above; however, as described herein either one or both edges of the pulse could be adjusted, as desired. As depicted, an input PWM signal ($PWM_i$) 502 is applied to the gate of MOS transistor 506, which has its source connected to ground and its drain connected to node 508. The capacitor ($C_t$) is coupled between node 508 and ground. Node 508 is also connected to a voltage-to-current ($G_m$) block 512. The supply voltage ($V_p$), which represents the estimated amplitude of the output signal ($V_o$) in the equations above, is provided as the voltage input to the voltage-to-current ($G_m$) block 512 and then as a current to node 508 to charge capacitor ($C_t$). The voltage on node 508 is then connected to an input of comparator 510, which also receives a threshold voltage ($V_t$) as an input. The threshold voltage ($V_t$) can be made to be proportional to the supply absolute voltage ($V_p$) plus a bias voltage ($V_b$). The comparator 510 will output a high level if node 508 is below the threshold voltage ($V_t$) and a low level if node 508 is above the threshold voltage ($V_t$). The comparator 510 operates to produce an output PWM signal ($PWM_d$) 504.

It is noted that the supply absolute voltage ($V_p$) is used here to represent the estimated amplitude of the output signal ($V_o$). And the desired or reference voltage ($V_r$) is used to represent the desired or reference amplitude of the output signal.

For the negative edge delay cell 500 of FIG. 5, the delay ($\tau_{df}$) 520 between the input falling edge of the input PWM signal ($PWM_i$) 502 and output falling edge of the output PWM signal ($PWM_d$) 504 is given by the following equation:

$$\tau_{df} = (C_t/G_m) * V_t / V_p + \tau_a,$$

where $\tau_a$ represents the delay of the comparator propagation.

If the threshold voltage ($V_t$) is made inversely proportional to the power supply ripple (or AC) voltage ($V_n$) weighted by factor ($\alpha$) proportional to the desired pulse width is added to a bias voltage ($V_b$), then the following expression can be made:

$$V_t = -\alpha * V_n + V_b = -\alpha * (V_p - V_r) + V_b,$$

the delay can be seen to be:

$$\tau_{df} = -(C_t/G_m) * \alpha * V_n / V_p + (C_t/G_m) * V_b / V_p + \tau_a,$$

Which is of the form given above for $PW_c$ plus a bias latency, where $$PW_i = (C_t/G_m) * \alpha$$

is a weighting factor for scaling the correction proportional to the desired pulse width, and the bias latency ($\tau_l$) is given by:

$$\tau_l = [(C_t/G_m) * V_b / V_p] + \tau_a$$

If the bias voltage ($V_b$) is set proportional (or equal) to the voltage controlling the capacitor ramp current (e.g., $V_p$ through block 512), the bias latency to a first order will be time invariant and determined by the RC time constant plus the comparator propagation delay ($\tau_a$).

With this circuit structure of FIG. 5, a sub-system can be configured for robustly compensating the PWM signal for variations in supply voltage or output pulse amplitude. One possible implementation to achieve this result is depicted with respect to FIG. 6A and the timing diagram of FIG. 6B.

Single-Ended Circuit Solution Embodiment

Figure 6A:
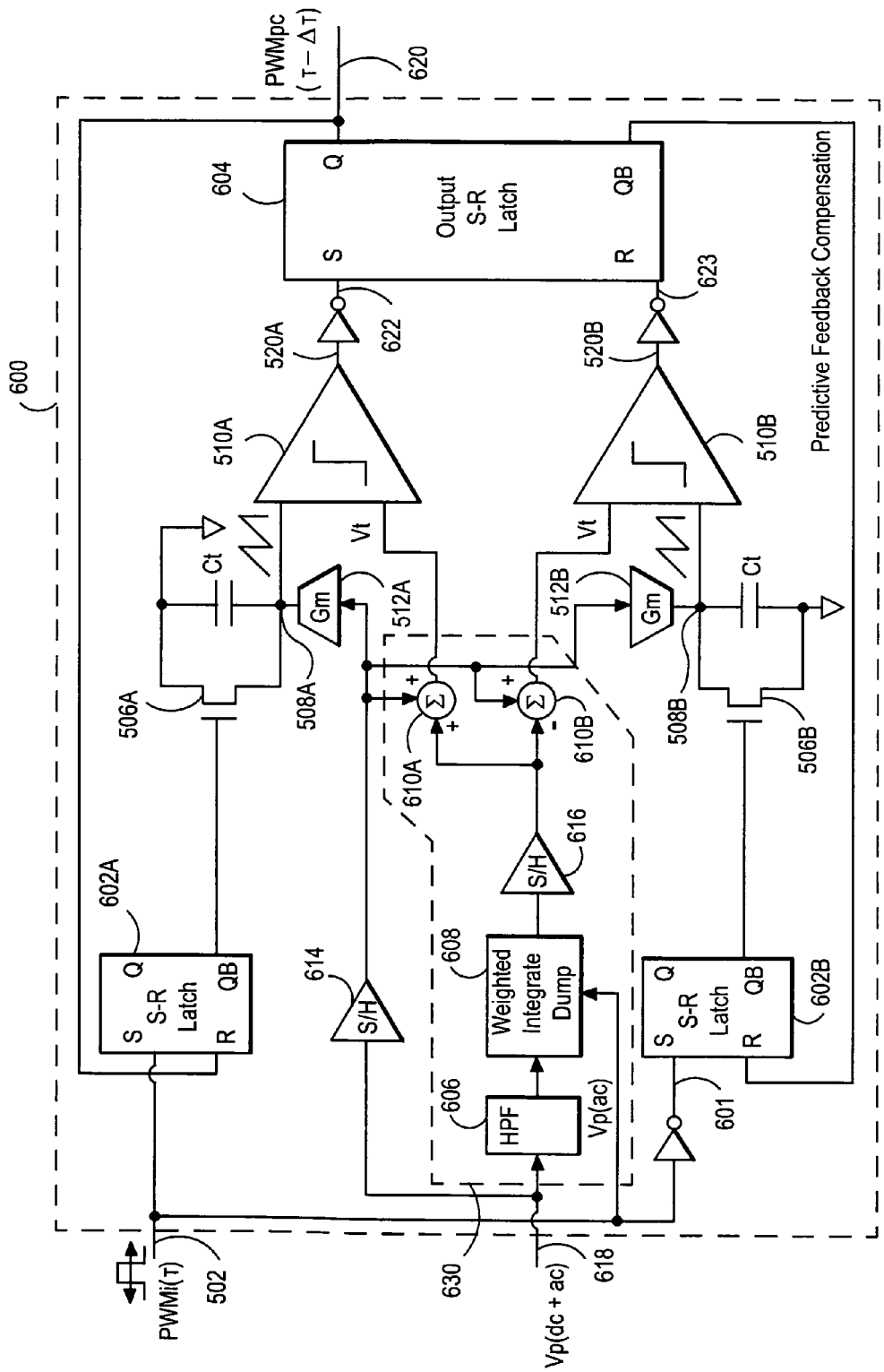
FIG. 6A is a circuit diagram for a predictive feedback compensation (PFC) with open loop pulse width adjustment.
Figure 6B:
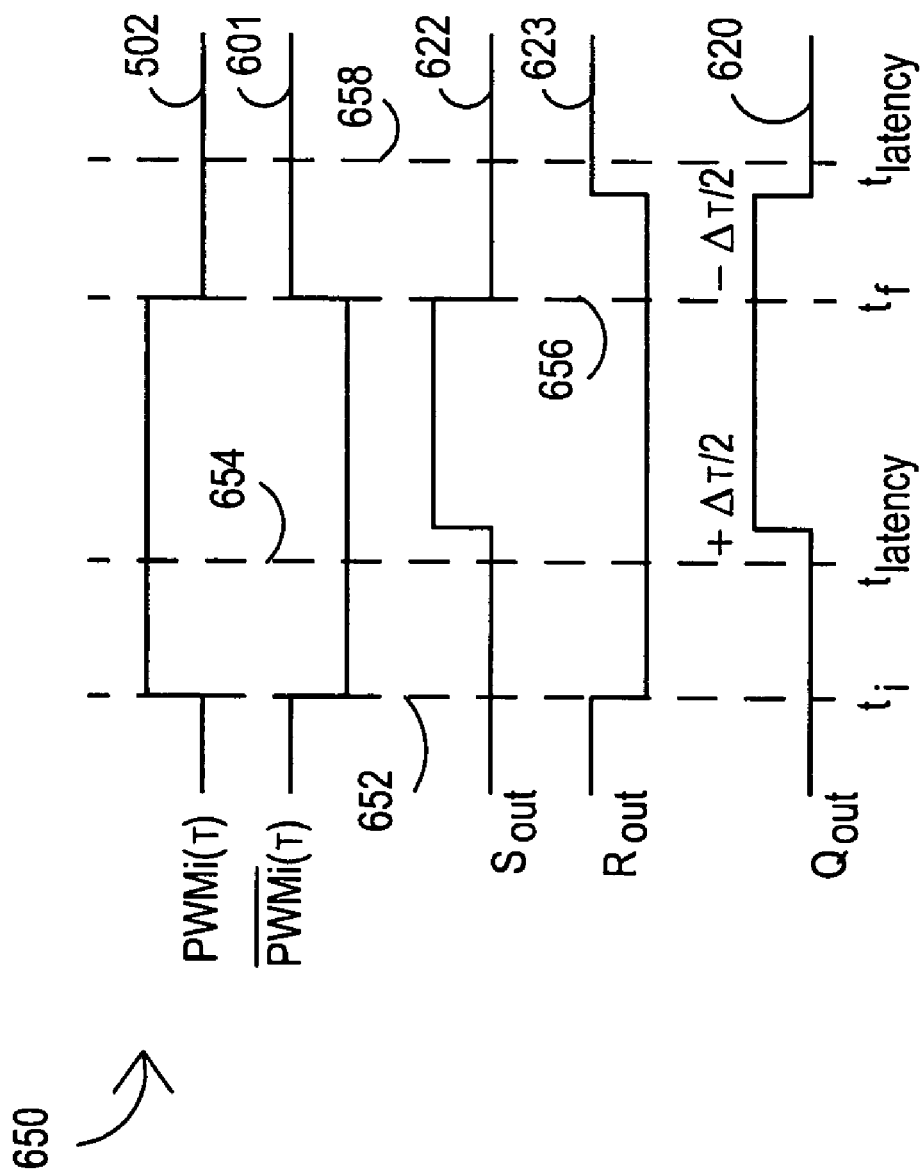
FIG. 6B is a timing diagram for the predictive feedback compensation (PFC) of FIG. 6A.

FIG. 6A is a circuit diagram for a single-ended embodiment for a predictive feedback compensation embodiment 600 with open loop pulse width adjustment and using the negative edge delay cell of FIG. 5. FIG. 6B is a timing diagram for the predictive feedback compensation of FIG. 6A. As can be seen from inspection of the sub-system diagram in FIG. 6A, the upper negative edge delay cell is configured to delay the rising edge and the lower cell is configured to delay the falling edge. The output transitions for S-R latch 604, as shown in FIG. 6B, are in response to the delayed edge in each case, resulting in an output pulse (PWMpc) with a rising edge delayed by $\tau_l+\tau_{dr}$ and a falling edge delayed by $\tau_l+\tau_{df}$, where $\tau_l$ is the bias latency, where $\tau_{dr}$ is the rising edge delay and where $\tau_{df}$ is the falling edge delay.

As depicted in the embodiment 600 of FIG. 6A, the uncompensated PWM input signal ($PWM_{i(T)}$) 502 is received and sent to the S-input of the S-R latch 602A. The inverted output (QB) of the S-R latch 602A is provided to the gate of transistor 506A, which is part of the upper negative edge delay cell. The node 508A is provided to the comparator 510A. And output 520A from comparator 510A is then provided through an inverter as signal 622 to the S-input of output S-R latch 604. The non-inverted output (Q) of the S-R latch 604 is the pre-compensated PWM input signal (PWMpc) 620 that has had the time (T) of its pulse width adjust by a correction factor ($\Delta T$) so that the new pulse width is $T-\Delta T$, as discussed in more detail below. The difference between the uncompensated PWM input signal ($PWM_{i(T)}$) and the pre-compensated PWM input signal (PWMpc) 620 would represent the pulse width adjustment used to compensate for amplitude errors.

As depicted in the embodiment 600 of FIG. 6A, the uncompensated PWM input signal ($PWM_{i(T)}$) 502 is also sent through an inverter as signal 601 to the S-input of the S-R latch 602B. The inverted output (QB) of the S-R latch 602B is provided to the gate of transistor 506B, which is part of the lower negative edge delay cell. The node 508B is provided to the comparator 510B. And output 520B from comparator 510B is then provided through an inverter as signal 623 to the R-input of output S-R latch 604.

It is noted that the non-inverted output (Q) and the inverted output (QB) of the S-R latch 604 is also sent back to be the R-inputs of S-R latch 602A and S-R latch 602B, respectively. It is further noted that the two input S-R latches 602A and 602B enable operation with narrow pulses by preventing the trailing edge from discharging the ramping capacitors ($C_t$) before the delayed output transitions. These additional S-R latches are not required for fundamental operation, but does allow operation to the maximum modulation index while helping to prevent inadvertent pulse swallowing.

As discussed with respect to FIG. 5, the supply absolute voltage ($V_p$) is provided to nodes 508A and 508B through voltage-to-current ($G_m$) blocks 512A and 512B in each delay cell. It is further noted that a sample-and-hold (S/H) block 614 has also been included before voltage-to-current ($G_m$) blocks 512A and 512B to capture the supply absolute voltage ($V_p$) at desired points of time during the operation of the circuitry.

The threshold voltages ($V_t$) for comparator 510A and comparator 510B are generated from the supply absolute voltage ($V_p$) 618 using circuitry 630. Circuitry 630 acts as the amplitude error prediction circuitry in this embodiment. Supply absolute voltage ($V_p$) 618 includes both a DC (desired or reference voltage—$V_r$) component and an AC (ripple voltage—$V_a$) component as discussed above. In one embodiment the, supply absolute voltage ($V_p$) 618 is provided to a high pass filter (HPF) 606 that filters out the DC component. For example, a HPF 606 that rejects frequencies below about 20 Hz can be used to pass the ripple or AC component ($V_n$) of the supply absolute voltage ($V_p$). The output ($V_n$) of HPF 606 is then provided to block 608 that is configured to provide a weighted-integrate-and-dump function on the ripple (or AC) component ($V_n$) of the supply voltage ($V_p$) using the pulse width timing of the uncompensated PWM input signal ($PWM_{i(T)}$) 502. The output of block 608 is provided through a sample-and-hold (S/H) block 616 as a positive input to summation block 610A and as a negative input to summation block 610B. Supply absolute voltage ($V_p$) is also provided through sample-and-hold (S/H) block 614 as positive inputs to summation blocks 610A and 610B to set the bias latency for the PFC. The output of summation block 610A is provided as the threshold voltage ($V_t$) input to comparator 510A, and the output of summation block 610B is provided as the threshold voltage ($V_t$) input to comparator 510B.

FIG. 6B is a timing diagram 650 for the embodiment 600 of FIG. 6A. Represented in timing diagram 650 is the input PWM signal ($PWM_{i(T)}$) 502, inverted input PWM signal ($PWM_{i(T)\_}$bar) 601, the output signal ($S_{out}$) 622 provided to the S-input of S-R latch 604, the output signal ($R_{out}$) 623 provided to the R-input of S-R latch 604, and the pre-compensated PWM input signal (PWMpc) 620 from the Q output ($Q_{out}$) from S-R latch 604. As depicted, dotted line 652 represents the rising edge timing ($t_r$) for the original input PWM pulse. Dotted line 654 represents the position of the rising edge if moved solely due to the fixed timing latency ($t_{latency}$) of the PFC circuitry 600. Dotted line 656 represents the falling edge timing ($t_f$) for the original input PWM pulse. And dotted line 658 represents the position of the falling edge if moved solely due to the fixed timing latency ($t_{latency}$) of the PFC circuitry 600. As shown, the pre-compensated PWM input signal (PWMpc) 620 has had its rising edge delayed by $+\Delta T/2$ from the latency only timing and has had its falling edge sped up by $\Delta T/2$ from the latency only timing so that the entire pulse width (T) has been narrowed by a total of $\Delta T$ to produce an output width of $T-\Delta T$, as indicated above and discussed in more detail below.

It is noted that the delay latency ($\tau_{latency}$) includes the comparator propagation delay and a constant delay set by bias threshold ($V_t$) on the delay cell comparators 510A and 510B. By setting this bias threshold voltage ($V_t$) proportional (or equal) to the power supply absolute voltage ($V_p$) that is also setting the current in the timing capacitors ($C_t$), variations in the voltage track out and the constant delay portion of the delay latency depends only on the ($C_t/G_m$) time constant. Preferably, the absolute value of the latency is made large enough to provide compensation for the maximum peak to peak variation in the supply voltage ($V_p$).

It is further noted that while FIG. 6A shows two voltage-to-current converters, this is merely illustrative convenience for clarifying the circuit operation. Because the capacitor charging currents are configured to be identical for the upper and lower path, a single voltage-to-current converter can be used with a dedicated current mirror leg for each charging capacitor.

Differential Mode Operation

In a further embodiment, the rising and falling edge delay differences are configured to move in equal and opposite directions proportional to the ripple (or AC) component of the supply absolute voltage ($V_p$) weighted by the pulse width. Employing this type of differential edge delay scheme (e.g., as opposed to a single edge scheme) helps maintain the relative position of pulse centers between the input PWM pulse and the adjusted pre-compensated pulse. In alternative embodiments, the general scheme can also be employed whereby only one edge moves while the other remains relatively fixed. Still further, both edges can be moved, but by different amounts.

One way to generate the ripple (or AC) component ($V_n$) of the supply absolute voltage ($V_p$) is by using a high pass filter, such as HPF 606 in FIG. 6A. Another approach to obtain this ripple (or AC) component of the supply absolute voltage ($V_p$) is to subtract from the supply absolute voltage ($V_p$) a fixed reference voltage representing the DC component of the supply absolute voltage ($V_p$). For example, a fixed reference could be the supply absolute voltage ($V_p$) filtered by a low pass filter, or it could be a locally generated voltage. Any static offset between this reference voltage and the actual average output stage supply voltage, however, will result in a static gain adjustment in the output stage degraded power supply rejection performance as set forth below.

One convenient way to weight the supply ripple (or AC) voltage proportional to the pulse width is with a simple integrator such that the output amplitude error prediction is given by:

$$\Delta V_t = \alpha * V_n = [\tau_i/(C_i * R_i)] * V_n$$

where $\tau_i$=input pulse width per frame, and where Ci and Ri are the integration capacitor and resistor, respectively.

This presents a small real time problem since the leading edge must be delayed before the current pulse width is known. Therefore, it is necessary to estimate, or predict, the current pulse width and a ripple (or AC) component of the power supply voltage based on previous values. For simplicity, it can be assumed that the pulse width and supply ripple voltage component associated with the previous pulse is a good predictor for the current values. In FIG. 6A, this simple predictor is implemented for the ripple (or AC) signal and the supply absolute voltage $V_p$ with a sample-and-hold circuit triggered off the falling edge of the PWMi pulse. While this assumption results in good performance, the prediction can be significantly improved with the enhancement discussed in more detail below.

Pulse Width Correction Analysis

Ultimately, the comparator threshold voltage ($V_t$) includes two components: the first being a prediction of the supply absolute voltage $V_p$ and the second being a prediction of the power supply ripple (or AC) voltage $V_n$ weighted by the pulse width using an integrator block. The sum of these two components is applied to the $V_t$ of the rising edge delay cell by block 610A, and the difference of these two components is applied to the $V_t$ of the falling edge cell by block 610B. The first component sets a common mode delay for the rising and falling edges, and the second component sets a differential mode delay that symmetrically modulates the pulse width, where the rising edge delay ($\tau_{dr}$) and the falling edge delay ($\tau_{df}$) can be represented by the following:

$$\tau_{dr} = [(C_f/G_m)/(C_i * R_i)] * \tau_i * (V'_n/V'_p) + C_f/G_m + \tau_a,$$

$$\tau_{df} = -[(C_f/G_m)/(C_i * R_i)] * \tau_i * (V'_n/V'_p) + C_f/G_m + \tau_a,$$

where $V'_n$ and $V'_p$ represents the estimated values of the voltages $V_n$ and $V_p$. Thus, the adjustment in the output pulse width is defined as the difference in delay between the falling and rising edges, $$\Delta\tau_d = \tau_{df} - \tau_{dr} = -[(2*C_f/G_m)/(C_i * R_i)] * \tau_i * (V'_n/V'_p)$$

$$\Delta\tau_d = \tau_{df} - \tau_{dr} = -K * \tau_i * (V'_n/V'_p),$$

where $K = 2*(C_f/C_i)*(1/(G_m * R_i))$ and $PW_i = K * \tau_i$

This is exactly the form required for perfectly cancelling the effect of power supply variations at the output of the switching amplifier, while maintaining the relative pulse center position. The resulting filtered output signal Vo can be described by the following relationship, where T is the PWM frame period:

$$Vo = [(\tau_i + \Delta\tau_d)/T] * V_p$$

$$Vo = (\tau_i/T) * V_p * (1 + \Delta\tau_d/\tau_i)$$

$$Vo = (\tau_i/T) * V_p * (1 - K * V'_n/V'_p)$$

$$Vo = (\tau_i/T) * (V_p - K * V'_n * V_p/V'_p)$$

$$Vo = (\tau_i/T) * (V_r + V_n - K * V'_n * V_p/V'_p)$$

$$Vo = (\tau_i/T) * \{V_r + V_n * [1 - K*(V'_n/V_n)*(V_p/V'_p)]\},$$

which shows that the power supply amplitude variation is attenuated by the factor $$\alpha = 1 - K*(V'_n/V_n)*(V_p/V'_p),$$

Where K is the product of three ratios given by $$K = 2*(C_f/C_i)*(1/(G_m * R_i)).$$

For ideal component matching and prediction, $\alpha=0$ and perfect cancellation results.

Component Mismatch and Prediction Errors

Given "r" is the component matching tolerance, error attributable to component mismatch is on the order of $(1-r)^3$, assuming pessimistically that the mismatches between resistors, capacitors and current mirrors are correlated. If r=0.1% for example, the power supply variation would be attenuated by more than 50 dB.

It is reasonable to assume that prediction error results primarily from estimating the supply ripple because the ripple will generally be a fraction of the supply absolute voltage. Therefore for a given absolute prediction error for the voltage level, the percentage mismatch for ($V_p/V'_p$) will be a fraction of the percentage mismatch for ($V'_n/V_n$).

Using only the previous sample of the weighted $V'_n$ to predict the next sample results in a prediction error equal to how much the power supply might change from sample to sample. For a tone, the maximum error occurs when the signal is at zero since this is the point of maximum rate of change. For a tone of frequency $f_m$ and PWM frame rate of $f_c$, the error will be $\sin(2*\pi*f_m/f_c)$. Assuming $f_c$=920 kHz, the resulting power supply ripple attenuation with full scale PWM modulation will be −43 dB for a 1 kHz tone and −29 dB for a 5 kHz tone.

This performance can be greatly improved upon by linearly interpolating the previous two samples to predict the next sample. This operation can be implemented with a 2× gain block and a sample/hold circuit.

Figure 7:
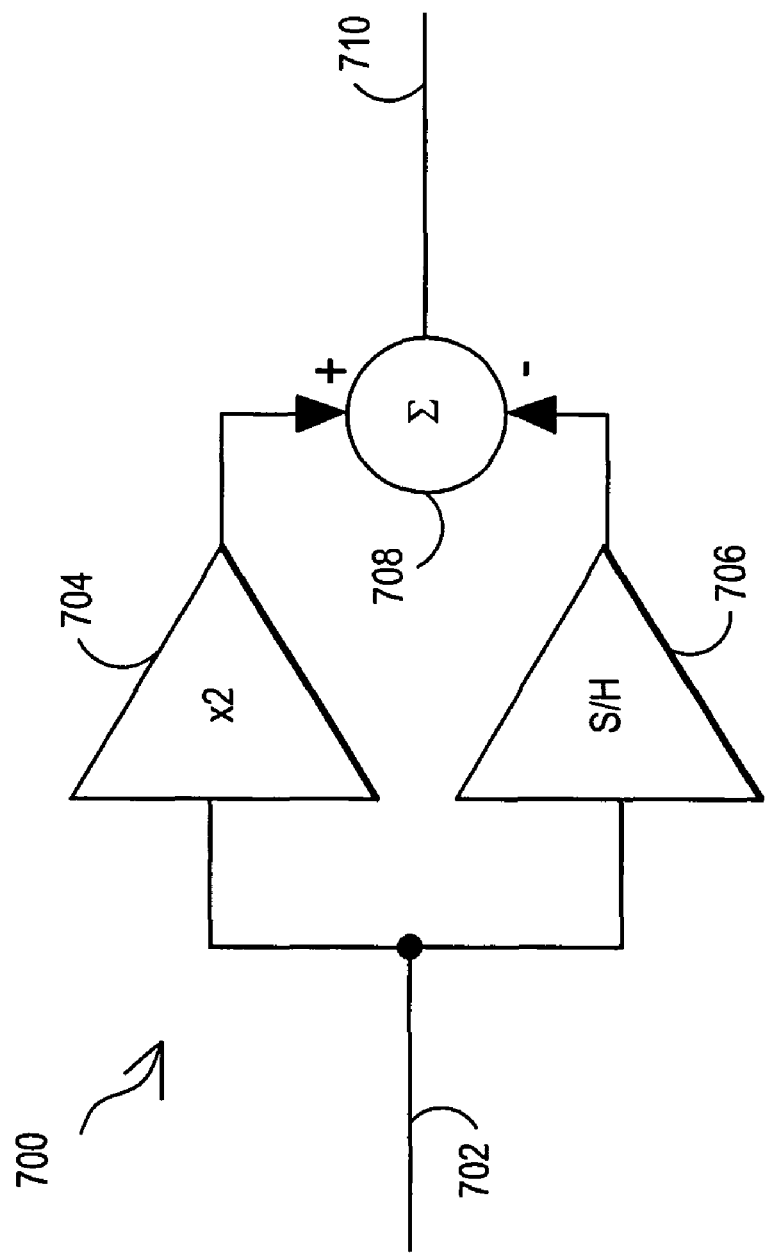
FIG. 7 is a circuit diagram for a linear interpolation predictor.

FIG. 7 provides a circuit diagram for an embodiment 700 for such a linear interpolation predictor. An input signal 702 is provided to sample-and-hold (S/H) circuitry 706 and to 2× gain block 704. The output of the gain block 704 is provided as a positive input to summation block 708, and the output of sample-and-hold (S/H) circuitry 706 is provided as negative input to summation block 708. The output of summation block 708 provides the output signal 710 for the linear interpolation predictor. The linear interpolation predictor 700 can be inserted in place of the sample-and-hold (S/H) circuitry 616 in FIG. 6A.

When the linear interpolation predictor 700 of FIG. 7 is applied in place of the sample-and-hold (S/H) circuitry 616 in FIG. 6A, the output amplitude error prediction value $\Delta V_t$ produced by this circuitry can be expressed as:

$$\Delta V_t = \tau_i * V_{ni} = \tau_i * (2 * V_{n(i-1)} - V_{n(i-2)}),$$

where $V_{nk}$ represents the output pulse amplitude estimation at sample time k.

The maximum error will occur when the rate of change of the signal derivative is maximum, which occurs at the signal peak, and can be shown to be $2*(1-\cos(2*\pi*f_m/f_c))$. Again assuming $f_c$=920 kHz, the resulting power supply ripple attenuation with full scale PWM modulation will be –86 dB for a 1 kHz tone and –58 dB for a 5 kHz tone.

In the case of a double sided BD modulated PWM signal (described in more detail below) in which the differential pulse width is what is compensated, the effective $f_c$ is double and the resulting attenuation is –98 dB for a 1 kHz tone and –70 dB for a 5 kHz tone.

Using the two previous samples to estimate the next provides sufficient prediction accuracy that component matching becomes the dominant limiting factor for PSR enhancement using this technique.

It is further noted that static DC voltage offset mismatch between threshold voltages ($V_t$) or the comparators 510A and 510B do not impact the PSR (power supply rejection) attenuation, but do introduce a DC offset ($V_{os}$) at the output expressed by the following:

$$V_{os} = \tau_{os} * V_p / T$$

$$V_{os} = V_{tos} * C_t / (T * G_m),$$

Where $\tau_{os}$ the delay offset caused by a comparator threshold voltage offset of $V_{tos}$.

Assuming a common mode latency $C_t/G_m$<10% of the PWM frame rate (this is a reasonably nominal assumption although dependent on specific system requirements and design choices), the resulting open loop output DC offset will be 5% of the delta offset between the comparators.

Jitter and Noise Considerations

It is noted that the primary design concerns for the blocks in FIG. 6A are component matching and minimizing noise induced jitter. Component mismatch in and of itself only affects the attainable power supply ripple attenuation and does not degrade the desired PWM signal integrity. On the other hand, noise induced jitter will not affect the attainable attenuation but will degrade desired PWM signal SNR (signal-to-noise ratio). As with any circuits through which the critically timed PWM signals pass, care must be taken to minimize noise inducing jitter on the transition edges. While most of this is circuit design, the one system design consideration is to minimize the common mode latency so that the charging capacitor ramp is as steep as possible. While it should not be necessary in general, one could choose to trim the voltage-to-current converter resistor $R_m$ at post-manufacturing test to achieve greater control over the common mode latency and the charging capacitor ramp time.

Combining PFC Circuitry with Traditional Feedback Circuitry

Using PFC circuitry as described herein, the power supply rejection of the open loop forward path in a Class D switching amplifier can be improved by more than 50 dB. Even so, other time and amplitude based non-idealities and non-linearities are potentially left unchecked. Therefore, it is desirous to add classical feedback in addition to PFC to correct for these residual errors and further enhance the performance of the amplifier.

In fact, the same pulse edge delay cell used for PFC can also be used for feedback control by summing the integrated feedback control error signal with the output of the predictive integrator. This will cause the pulse width to incrementally adjust in an effort to drive the instantaneous error signal to zero.

Figure 8A:
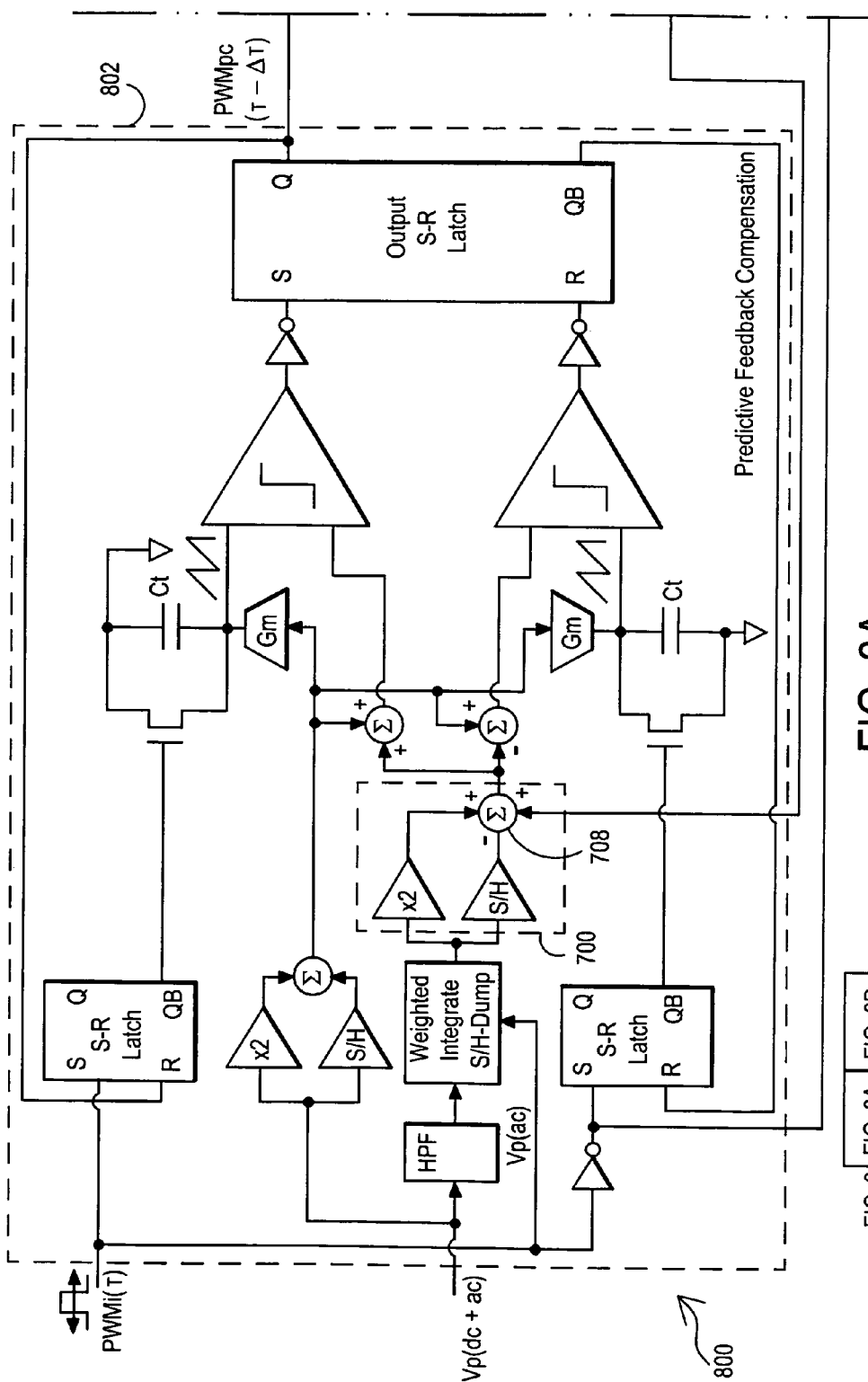
FIGS. 8A and 8B are circuit diagrams for a PWM switching amplifier including a predictive feedback compensation (PFC) having a linear interpolation predictor and a feedback integrator.
Figure 8B:
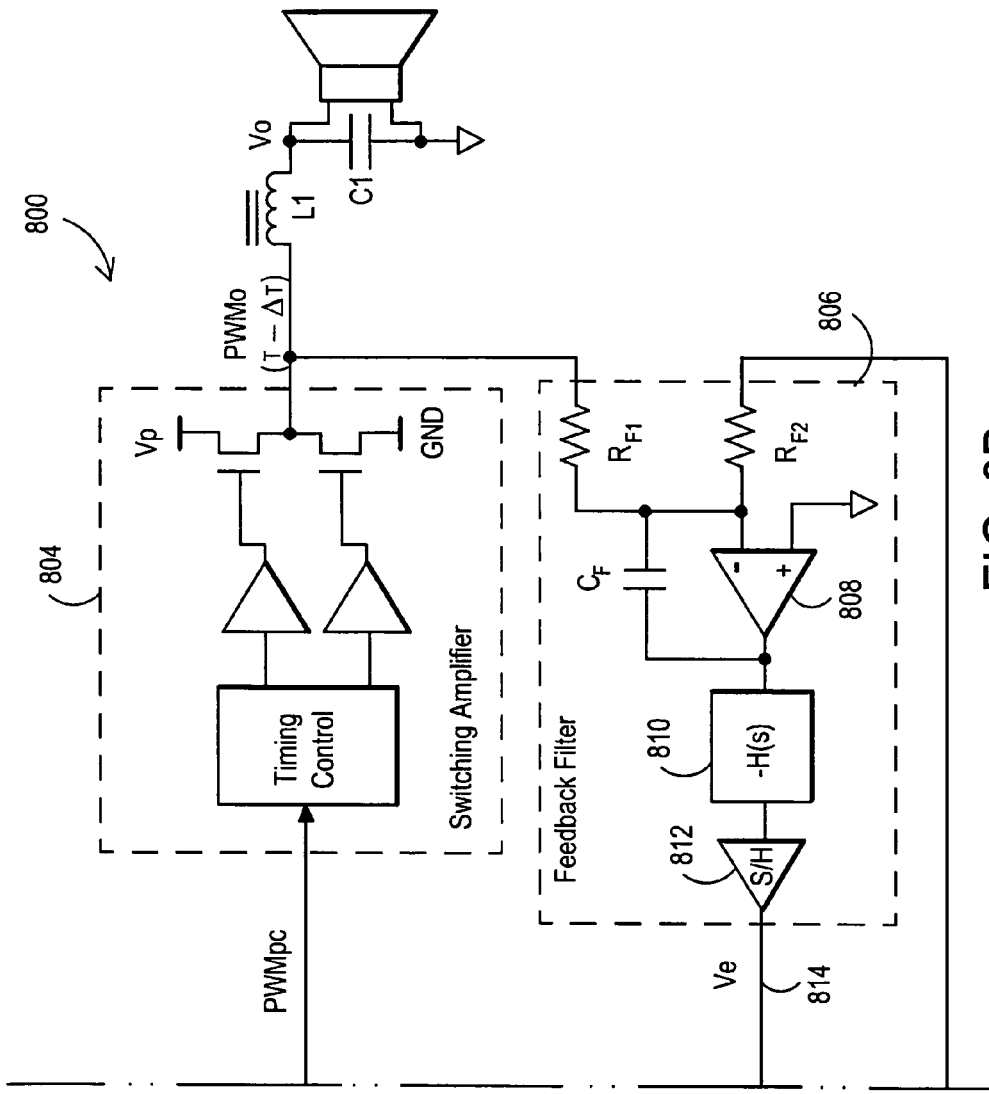

FIGS. 8A and 8B together provide a circuit diagram for an embodiment 800 of a predictive feedback compensation including a linear interpolation predictor and a feedback integrator. The predictive feedback compensation 802 is configured the same as the embodiment 600 of FIG. 6A, except that linear interpolation predictor 700 has been inserted in place of the sample-and-hold (S/H) circuitry 616. In addition, a single-ended switching amplifier 804 is also depicted that receives the pre-compensated PWM input signal (PWMpc) from the predictive feedback compensation 802. The switching amplifier 804 is configured the same as the B-pulse portion of switching amplifier 106 in FIG. 3. And similar to the embodiment of FIG. 3, the switching amplifier 804 drives a speaker with an output voltage ($V_O$) generated by passing an output PWM signal ($PWM_o$) having a pulse width (T) corrected by $\Delta T$ through reconstruction low pass filter circuitry including inductor L1 and capacitor C1.

Also depicted in FIGS. 8A and 8B is a feedback filter 806 that provides a feedback error signal ($V_e$) to the predictive feedback compensation 802. In particular, as depicted, the feedback integrator 806 includes a difference amplifier 808, a loop filter (–H(s)) 810, and sample-and-hold (S/H) circuitry 812. The difference amplifier 808 has its positive input coupled to ground and feedback capacitor $C_F$ coupled between its output and its negative input. The negative input is further coupled to the inverted input PWM signal ($PWM_{i\_}$ bar) through resistor $R_{F2}$ and to the output PWM signal ($PWM_o$) through resistor $R_{F1}$. These combined connections act to create a difference signal between the PWM input signal ($PWM_i$) and PWM output signal ($PWM_o$) at the negative input of amplifier 808. The output of difference amplifier 808 passes through loop filter (–H(s)) 810 and then through sample-and-hold (S/H) circuitry 812 to produce the error feedback signal ($V_e$) 814. This error feedback signal ($V_e$) 814 is then coupled to PFC 802 as an additional positive input to the summation block 708 within the linear interpolation predictor 700. It is noted, however, that embodiment 800 illustrates one way to integrate classical feedback with the PFC 802. Other feedback techniques could also be used.

In operation of the feedback filter 806, the integral of the difference between a level attenuated output pulse sequence ($PWM_o$) and the input reference pulse sequence ($PWM_i$) formed by amplifier 808 to create an instantaneous error signal. This instantaneous error signal is subsequently filtered by a loop filter (–H(s)) 810 to create the feedback control error signal. This feedback control error signal can also be pass through S/H circuitry 812 before being provided as the error feedback signal ($V_e$) to the PFC 802. If the error signal Ve is positive, meaning the area of the output pulse sequence ($PWM_o$) is larger than the area of the input pulse sequence ($PWM_i$), the pulse edge delay cell will decrease the pulse width until the area of the output pulses equal that of the input pulses and the instantaneous error signal is zero. It is noted that the error signal Ve could also be negative, meaning the area of the output pulse sequence ($PWM_o$) is smaller than the area of the input pulse sequence ($PWM_i$).

Advantageously, the feedback superimposes nicely onto the predictive feedback compensation without any mutual interference. The PFC eliminates most output error caused by power supply ripple, reducing the total amount of correction required by the traditional feedback network.

Application to Differential BTL Outputs

The preceding discussion dealt primarily with single-ended switching amplifier embodiments. The following discussion is directed to differential embodiments, an example for which is provided in FIGS. 9A and 9B.

In general, for differential BTL (bridge-tied load) applications, the single-ended implementation can be used for each signal, and the pulse width compensation will translate to the differential signal. However, this technique can also introduce an unwanted differential pulse phase modulation (i.e., pulse position shifting). In addition, if the common mode phase varies with respect to the differential mode (as in the case of common mode carrier suppression), the differential pulse widths will be modulated by the common mode phase variation. This is likely also true for any pulse width compensating scheme.

Therefore, for those applications where it is desired not to affect the differential mode phase, it may be preferred to implement the feedback and the PFC exclusively in differential space in such a way that the differential pulse center positions remain invariant. This requires that the respective pulse edges that define the differential pulse compensate in equal but opposite directions. In most cases for BD modulation, these defining pulse edges are associated with two distinct single-ended PWM signals and therefore the compensation must be coordinated between the two PWM signal edges.

Because of the symmetry of the BTL output for positive and negative signals, the required direction of compensation will be opposite depending on the sign of the signal. This complication is minor and as an example can be accommodated by using signal sign information to reverse the compensation direction for the edges of each respective PWM pulse. The sign information can be provided by the modulator or logically divined by comparing the positive/negative (P/N) or pulse-B/pulse-D (B/D) PWM signals.

Figure 9A:
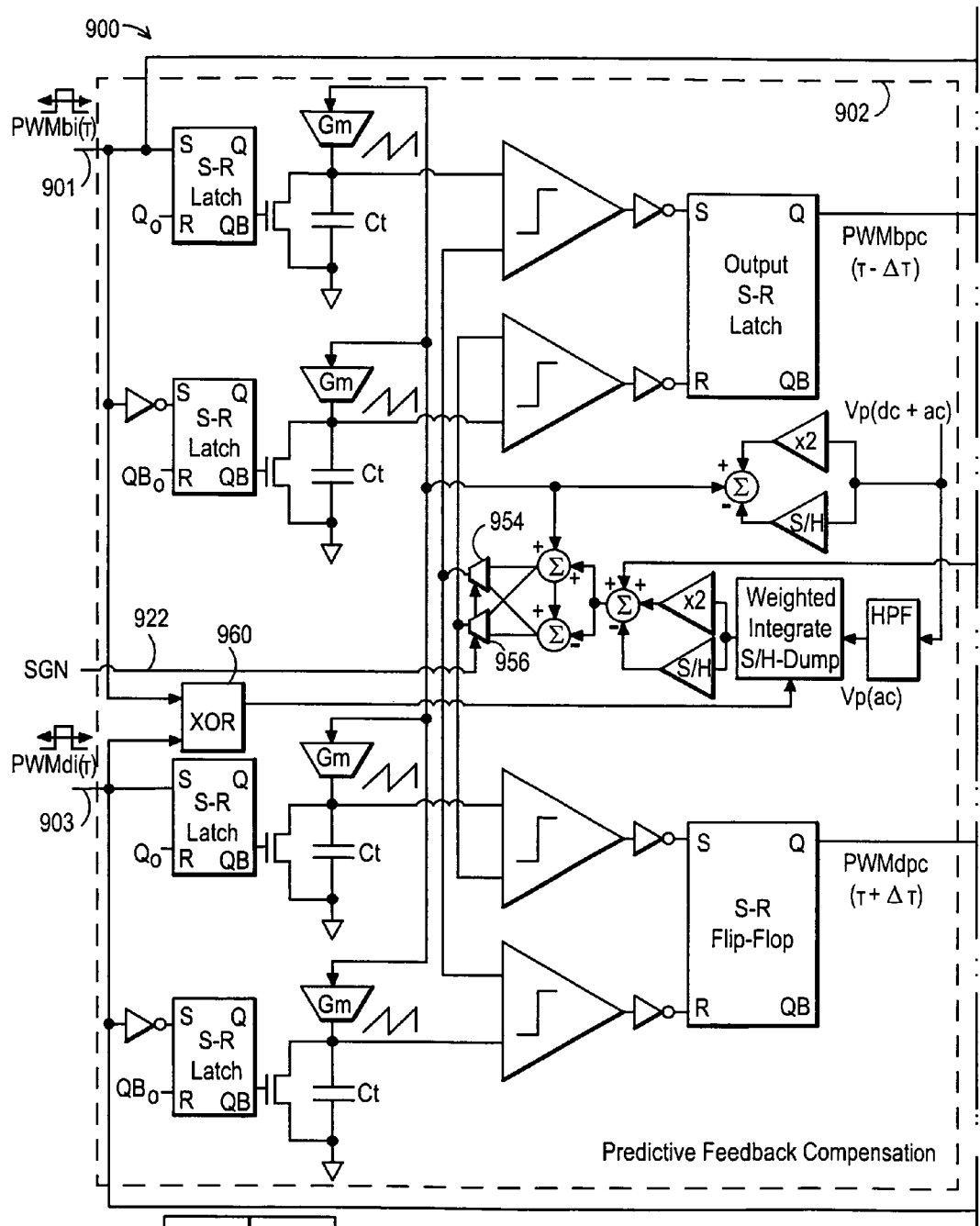
FIGS. 9A and 9B are circuit diagrams for a differential embodiment for a PWM switching amplifier including a predictive feedback compensation (PFC) and feedback filter.
Figure 9B:
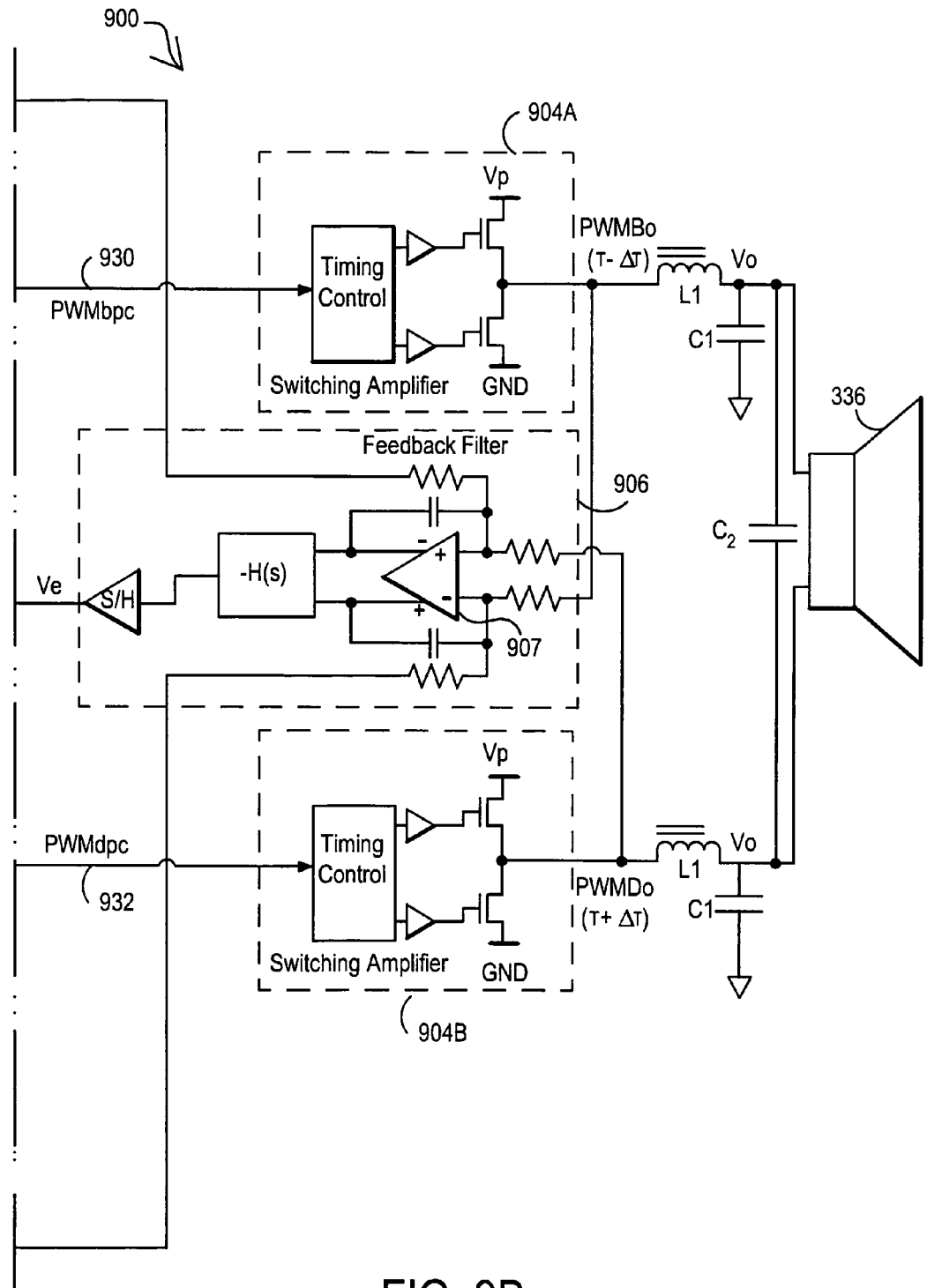

FIGS. 9A and 9B together provide a circuit diagram for a differential embodiment 900 for a predictive feedback compensation (PFC) 902 including a feedback integrator 906. As depicted, the PFC 902 includes a first circuit configured similar to PFC embodiment 802 of FIG. 8 that receives a positive differential input PWM signal ($PWM_{bi}(T)$) 901 and produces a first pulse width adjusted output signal $PWM_{bpc}$. PFC 902 also includes a second circuit configured similar to PFC embodiment 802 of FIG. 8 that receives a negative differential input PWM signal ($PWM_{di}(T)$) 903 and produces a second pulse width adjusted signal $PWM_{dpc}$. It is noted that the positive PWM signal ($PWM_{bpc}$) 930 and the negative PWM signal ($PWM_{dpc}$) 932 correlate to the B-pulse PWM signal (PWMB) and D-pulse PWM signal (PWMD) discussed in FIG. 3.

Further additions to the PFC 902 for the differential embodiment 900 include the XOR block 960, the sign (SGN) input signal 922, and the MUXs 954 and 956. The XOR block 960 receives the positive differential input PWM signal ($PWM_{bi}(T)$) 901 and the negative differential input PWM signal ($PWM_{di}(T)$) 903 and then provides an XORed output signal to the weighted-integrate-and-dump circuitry. The sign (SGN) signal 922 controls the MUXs 954 and 956 which receive outputs from each of the summation circuits that provide the threshold voltages ($V_t$) to the comparators in PFC 902.

The B-pulse PWM signal ($PWM_{bpc}$) 930 and the D-pulse PWM signal ($PWM_{dpc}$) 932 are provided to switching amplifiers 904A and 904B. This switching amplifier circuitry has been discussed above with respect to switching amplifier 106 in FIG. 3 and switching amplifier 804 in FIG. 8. As with the embodiment 300 of FIG. 3, the outputs from the switching amplifiers 904A and 904B are sent through reconstruction low pass filter (LPF) circuitry (L1, C1, C2) to drive an output device (e.g. speaker 336). As shown in FIG. 9, the output signal ($PWMB_{o(T-\Delta T)}$) of switching amplifier 904A has a pulse width of the base width (T) minus the pulse width adjustment ($\Delta T$). And the output signal ($PWMD_{o(T+\Delta T)}$) of switching amplifier 904B has a pulse width of the base width (T) plus the pulse width adjustment ($\Delta T$).

The feedback filter 906 is similar to feedback filter 806 of FIG. 8. In this embodiment, however, the difference amplifier 907 receives additional signals at its inputs. At its positive input, difference amplifier 907 receives output signal ($PWMB_{o(T-\Delta T)}$) from switching amplifier 904A through a resistor and the input signal ($PWM_{bi(T)}$) 901 through a resistor. At its negative input, difference amplifier 907 receives the output signal ($PWMD_{o(T+\Delta T)}$) from switching amplifier 904B through a resistor and the input signal ($PWM_{di(T)}$) 903 through a resistor. Similar to embodiment 806, feedback capacitors are connected between the inverted output and the positive input and between the non-inverted output and the negative input of the difference amplifier 907. The inverted and non-inverted outputs are then applied to the loop filter (−H(s)), which combines them and produces a signal for sample-and-hold (S/H) circuitry that produces the feedback error signal ($V_e$). As discussed with respect to FIG. 8, the feedback error signal ($V_e$) from feedback filter 906 can be provided to the summation block for the linear interpolation predictor circuitry within PFE 902.

Thus, embodiment 900 operates to implement a differential BTL switching amplifier using open loop pulse width adjustment with differential PFC based on the same PFC principle employed for the single-ended application, as discussed above, with a few adjustments. The adjustments for differential PFC 902 from PFC 802 include:

1. Integration of the varying delta component of the power supply is weighted by the differential pulse width, created by XORing the positive (P) and negative (N) input PWM signals 901 and 903 using XOR block 960.
2. The complementary threshold voltages for the delay comparators are cross coupled between the positive (P) pulse and the negative (N) pulse using MUXs 954 and 956, such that the P-pulse rising edge will adjust in the opposite direction of the N-pulse rising edge, and similarly for the respective falling edges.
3. A sign signal (SGN) 922 then controls MUXs 954 and 956 to determine which direction the respective rising edges adjust in response to the compensation prediction signal to insure the compensation is in the correct direction based on the sign of the signal.

To summarize differential operation of embodiment 906 of FIGS. 9A-B, the single-ended pulse widths are adjusted in opposite directions by equal amounts proportional to the differential pulse width with the relative direction of change determined by the sign signal (SGN) 922.

Closed Loop Pulse Width Adjustment Embodiments
(Timing Adjustment)

Figure 10A:
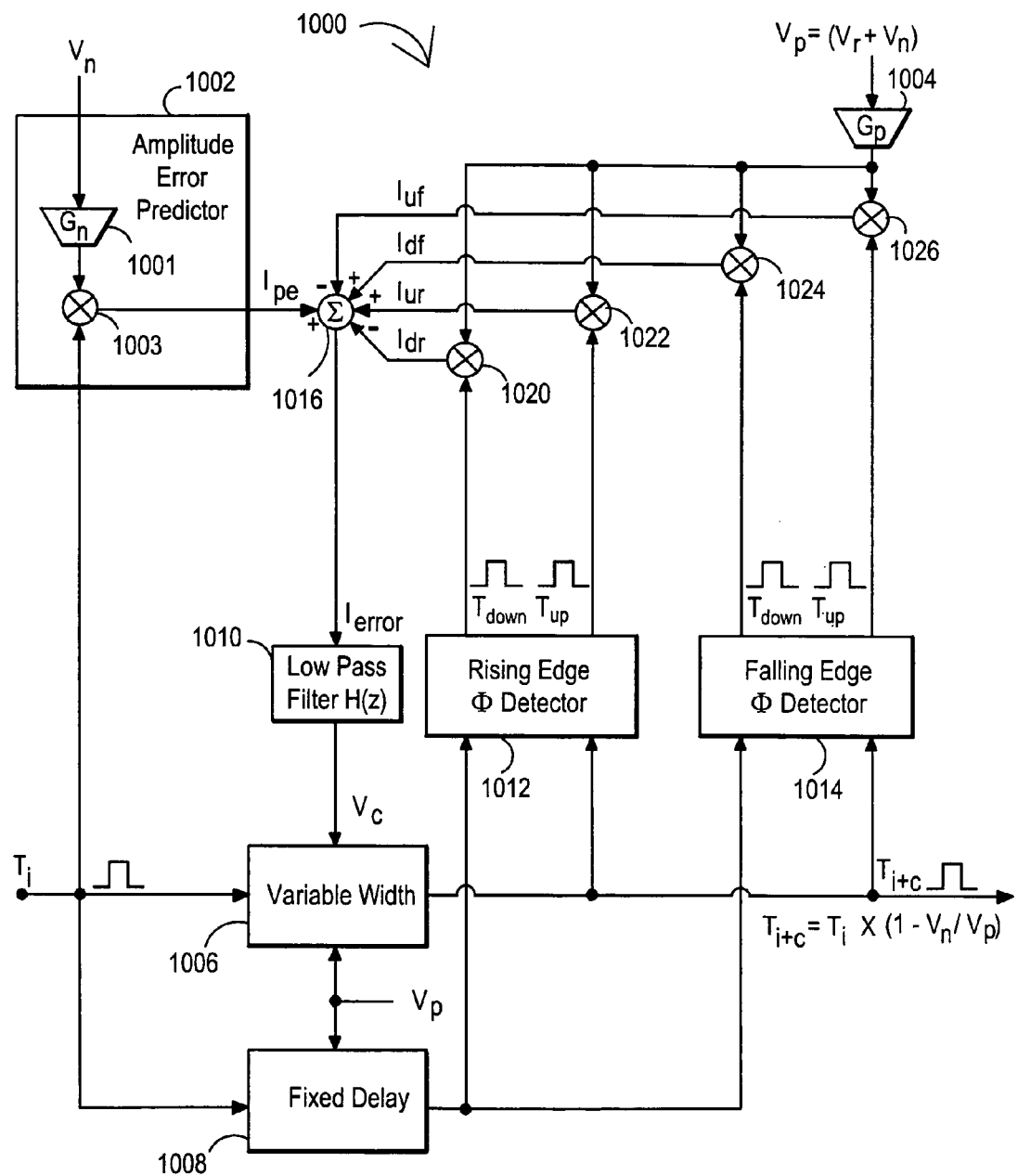
FIGS. 10A, 10B and 10C are block diagrams for embodiments of predictive feedback compensations (PFCs) with closed loop pulse width adjustment circuitry.
Figure 10B:
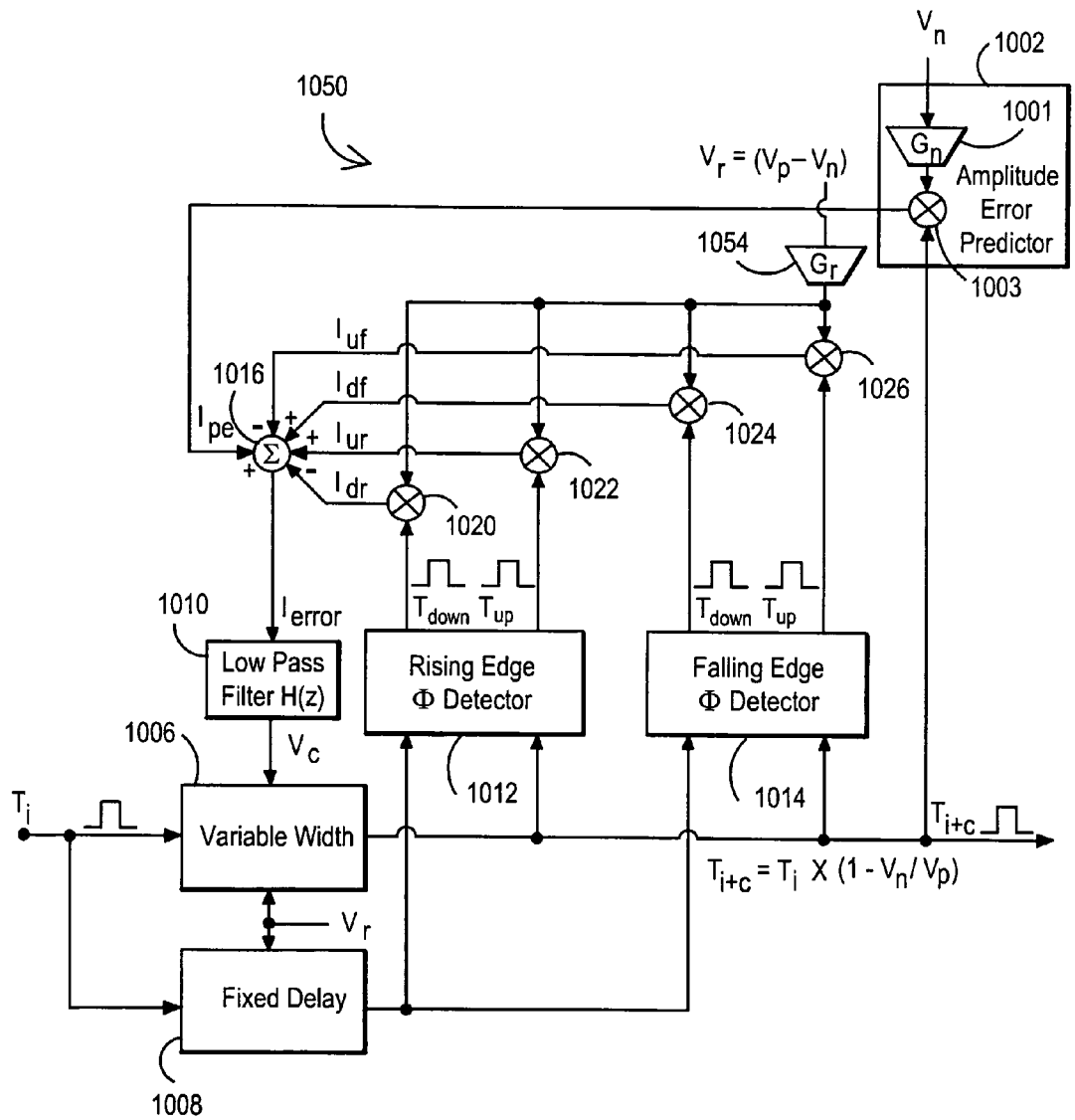
Figure 10C:
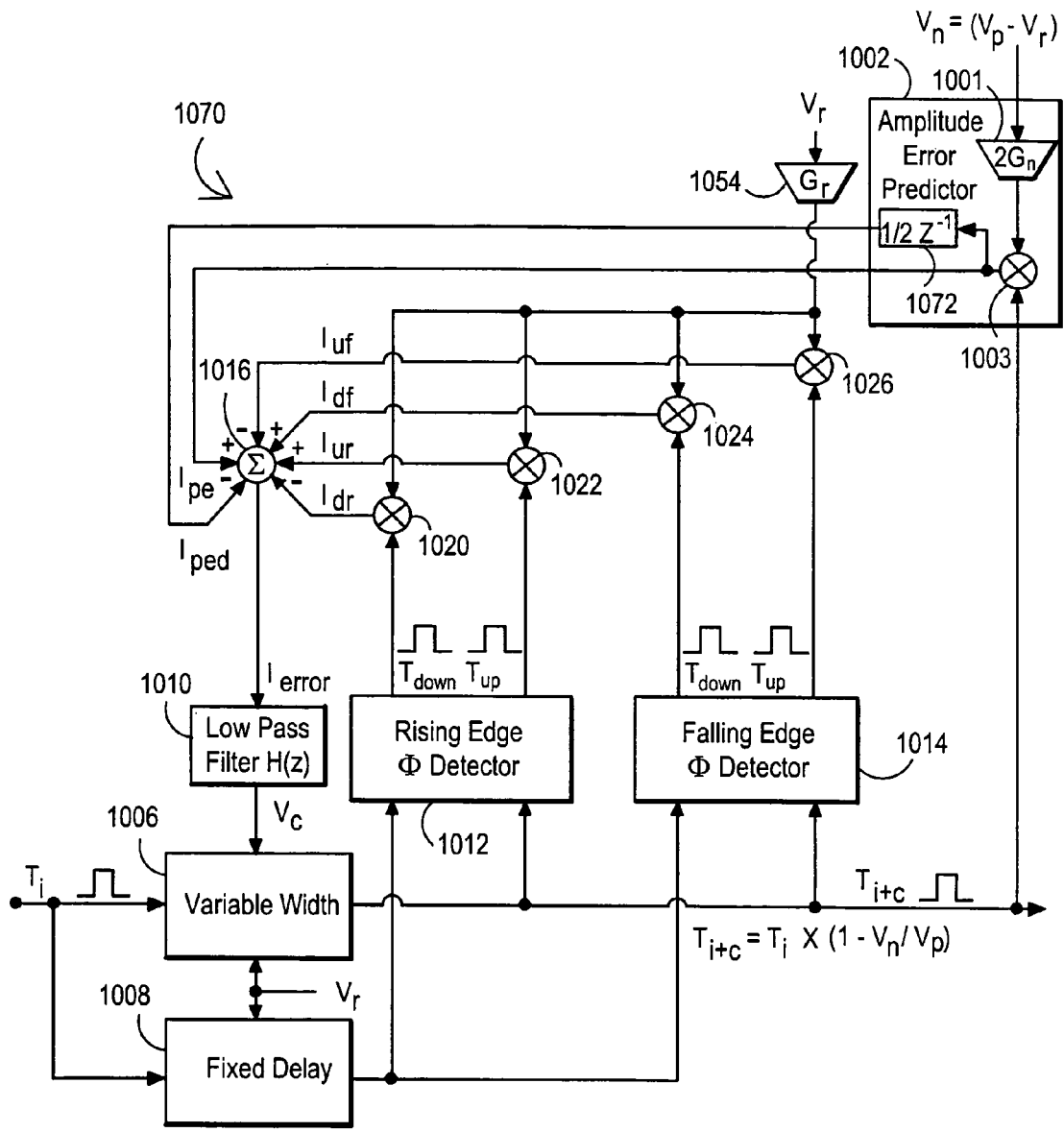
Figure 11:
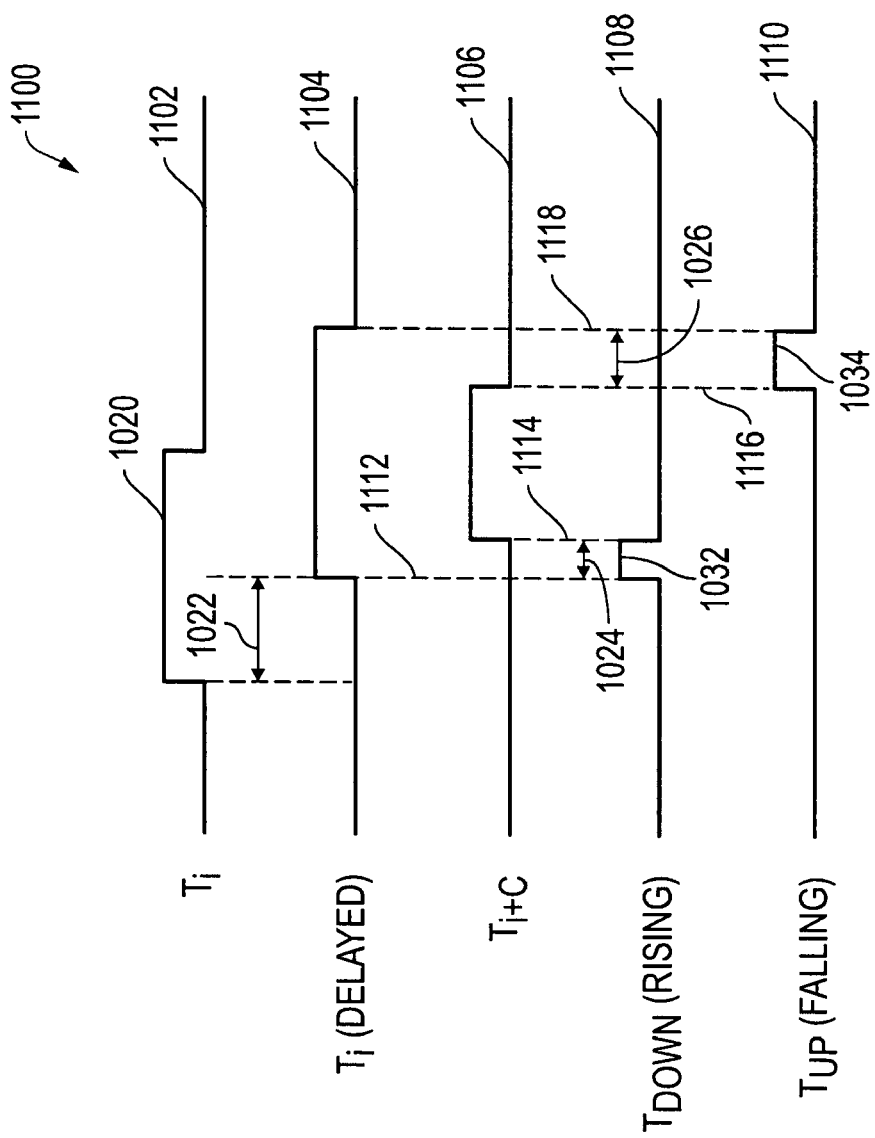
FIG. 11 is an example timing diagram for the closed loop pulse width adjustment circuitry of FIG. 10A.
Figure 12:
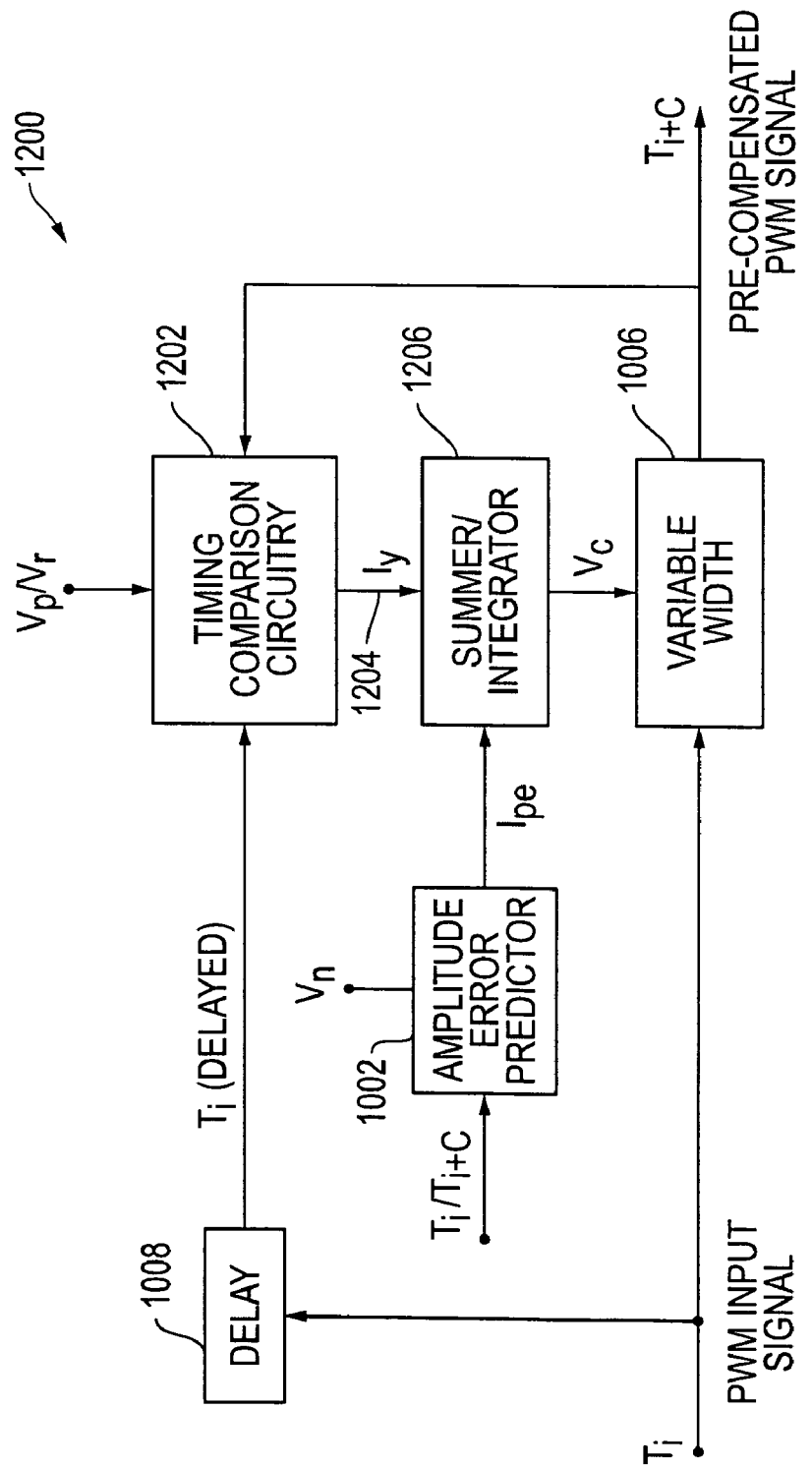
FIG. 12 is a block diagram for a more general embodiment for the closed loop pulse width adjustment embodiments of FIGS. 10A, 10B and 10C.

FIGS. 10A, 10B and 10C are block diagrams for embodiments of predictive feedback compensation (PFC) circuitry including closed loop pulse width adjustment to increase robustness of the width adjustment circuitry. FIG. 11 provides a timing diagram associated with the embodiment of FIG. 10A. And FIG. 12 provides a more general embodiment for the embodiments of FIGS. 10A, 10B and 10C.

The open loop PFC technique described above measures errors on the supply voltage and then adjusts the pulse width of the PWM signal to correct for noise on the supply voltage. It is also described above that the PFC techniques can measure the output amplitude of the PWM signal used instead of using the supply voltage. While these PFC techniques help to compensate for amplitude errors in the PWM output signal, the amount of cancellation is directly proportional to the accuracy of the measurement and adjustment. For 60 dB PSR improvement, precision on the order of 0.0001 is required. Achieving this level of precision requires (1) that the supply absolute and ripple voltage measurement is accurately made by the PFC circuitry, and (2) that the open loop pulse width adjustment is exactly correct. For example, if the noise on the supply voltage causes the pulse amplitude to be 10% too high, then the pulse width should be decreased by (1−1/1.1) or about 0.0909 times. To ease circuit requirements on the pulse width adjustment, timing feedback associated with the pre-compensated PWM signal can be used to set the correct amount of pulse width compensation. Feeding back the adjusted pulse width versus the original input pulse width permits residual timing errors of the pulse width adjustment circuit to be cancelled.

Looking first to FIG. 10A, a closed loop pulse width adjustment circuit embodiment 1000 is depicted that uses uncompensated pulse width weighting. A PWM input signal ($T_i$) is received by a variable width block 1006. The variable width block 1006 also receives a signal representing the total amplitude value ($V_p$) and an error correction signal ($V_c$) from the low pass filter (H(z)) 1010 with input ($I_{error}$). The output of variable width block 1006 is a width-adjusted, pre-compensated PWM signal ($T_{i+c}$), wherein $T_{i+c}=T_i*(1-V_n/V_p)$. A fixed delay block 1008 also receives the uncompensated PWM input signal ($T_i$) and the signal representing the total amplitude value ($V_p$). The fixed delay block 1008 then outputs the PWM input signal ($T_i$) with a fixed delay to an edge timing comparator, which also receives the pre-compensated PWM signal output by the variable width block 1006. It is noted that the variable width block 1006 can be implemented using a rising edge delay cell and a falling edge delay cell, for example, using circuitry based upon the embodiment for an edge delay cell shown in FIG. 5.

In the embodiment depicted, the edge timing comparator includes a rising edge phase (Φ) detector 1012 and a falling edge phase (Φ) detector 1014 and four mixers 1020, 1022, 1024, 1026. The rising edge phase (Φ) detector 1012 outputs a first DOWN signal ($T_{down}$) to mixer 1020 or a second UP signal ($T_{up}$) to mixer 1022 that represent rising edge timing error. Similarly, the falling edge phase (Φ) detector 1014 outputs a first DOWN signal ($T_{down}$) to mixer 1024 or a second signal ($T_{up}$) to mixer 1026 that represent falling edge timing error. The mixers 1020, 1022, 1024 and 1026 also receive a signal representing the amplitude absolute voltage ($V_p=(V_r+V_n)$) through voltage-to-current block ($G_p$) 1004. It is noted that the edge phase (Φ) detectors 1012 and 1014 can be implemented as logic circuitry. It is further noted that the mixers 1020, 1022, 1024 and 1026 can be implemented as charge pump circuits that output a charge based upon UP/DOWN timing signals received from the edge phase (Φ) detectors 1012 and 1014 and based upon the voltages input ($V_p$). The UP/DOWN timing signals and the voltage input ($V_p$) together determine how much charge is output in each period by the charge pumps. Conversion to a voltage control signal ($V_c$) then occurs in low pass filter 1010.

Thus, in operation, the rising edge phase (Φ) detector 1012 and the falling edge phase (Φ) detector 1014 will output its respective DOWN signal ($T_{down}$) or UP signal ($T_{up}$) depending upon the width adjustment timing relationship between a reference pulse width based upon the uncompensated PWM input signal ($T_i$) and the pre-compensated pulse width for the pre-compensated PWM signal ($T_{i+c}$). In particular, if the time-of-transition for the rising edge for the pre-compensated PWM signal ($T_{i+c}$) needs to be reduced (i.e., to occur earlier) to match a reference edge provided by the PWM input signal ($T_i$), then the rising edge phase (Φ) detector 1012 will output the DOWN signal ($T_{down}$) to mixer 1020. And if the time-of-transition for the rising edge for the pre-compensated PWM signal ($T_{i+c}$) needs to be increased (i.e., to occur later) to match a reference edge provided by the PWM input signal ($T_i$), then the rising edge phase (Φ) detector 1012 will output the UP signal ($T_{up}$) to mixer 1022. Similarly, if the time-of-transition for the falling edge for the pre-compensated PWM signal ($T_{i+c}$) needs to be reduced to match a reference edge provided by the PWM input signal ($T_i$), then the falling edge phase (Φ) detector 1014 will output the DOWN signal ($T_{down}$) to mixer 1024. And if the time-of-transition for the falling edge for the pre-compensated PWM signal ($T_{i+c}$) needs to be increased to match a reference edge provided by the PWM input signal ($T_i$), then the falling edge phase (Φ) detector 1014 will output the UP signal ($T_{up}$) to mixer 1026. It is noted the reference edges used by the rising edge phase (Φ) detector 1012 can be rising and/or falling edges based upon the PWM input signal ($T_i$), as desired. Similarly, the reference edges used by the falling edge phase (Φ) detector 1014 can be rising and/or falling edges based upon the PWM input signal ($T_i$), as desired.

For the embodiment 1000 in FIG. 10A, as indicated above, the mixers 1020, 1022, 1024 and 1026 receive a signal representing the amplitude absolute voltage ($V_p=(V_r+V_n)$) through voltage-to-current block ($G_p$) 1004. This amplitude absolute or total value ($V_p$) acts to weight the timing error signals. The average output of the edge timing comparator is the net error output ($I_Y$) of the four mixers, represented by:

$$I_Y=(I_{df}-I_{uf})+(I_{ur}-I_{dr})=(V_r+V_n)G_p\tau_c/T,$$

where $\tau_c$ represents the net difference between the two pulse widths.

The closed loop pulse width error signal is produced by summation block 1016. Summation block 1016 outputs the error correction signal ($I_{error}$) to low pass filter (H(z)) 1010, which in turn provides the predictive error correction signal ($V_c$) to the variable width block 1006. The summation block 1016 receives the output of the edge timing comparator, comprised of a falling-edge-up ($I_{uf}$) signal from mixer 1026 as a negative input, a falling-edge-down ($I_{df}$) signal from mixer 1024 as a positive input, a rising-edge-up ($I_{ur}$) signal from mixer 1022 as a positive input, and a rising-edge-down ($I_{dr}$) signal from mixer 1020 as a negative input. In addition, summation block 1016 also receives an input signal ($I_{pe}$) from amplitude error predictor circuitry 1002 that is proportional to the amplitude error associated with the ripple (or AC) component ($V_n$) of the output pulse amplitude. As depicted, the amplitude error predictor circuitry 1002 includes a mixer 1003 that mixes the PWM input signal ($T_i$) with a signal representing the ripple (or AC) component ($V_n$) of the output pulse amplitude through voltage-to-current block ($G_n$) 1001. The amplitude error predictor circuitry 1002 then outputs the loop input signal ($I_{pe}$) to summation block 1016 as a positive input.

The average error signal ($I_{error}$) produced in the embodiment 1000 can be represented by the equation:

$$I_{error}=I_{pe}+I_Y=[V_n\,G_n\,\tau_i/T]+[(V_r+V_n)\,G_p\tau_c/T].$$

where $V_n$ represents the ripple (or AC) component of the voltage supply or output pulse amplitude, $V_p=(V_r+V_n)$ represents the supply or output pulse amplitude absolute voltage, $V_r$ represents the desired or reference output pulse amplitude, $\tau_c$ represents the PWM pulse width pre-compensation, and $\tau_i$ represents the input PWM pulse width. In steady state, the feedback loop should force $I_{error}=0$, resulting in a pulse pre-compensation of:

$$\tau_c=\tau_i(G_n/G_p)(V_n/V_p).$$

which is of the desired form for perfect cancellation.

It is further noted that the gain value associated with the edge phase detection in blocks 1012 and 1014 in units of volt/time can be represented by the equation:

$$K_{101}=G_p*V_p/C_i$$

where $C_i=I_{error}$ filter integration capacitor

It is also noted that the gain value associated with the variable width block 1006 in units of time/volt can be represented by the equation:

$$K_\tau=C_T/(G_d*V_p)$$

where $C_T$=variable width timing capacitor

FIG. 10B is a block diagram for a closed loop pulse width adjustment circuit embodiment 1050 that uses pre-compensated pulse width weighting. The embodiment 1050 in FIG. 10B is similar to embodiment 1000 in FIG. 10A in most respects. One difference is in the in the second input to mixers 1020, 1022, 1024 and 1026. Rather than being a signal representing the supply or amplitude absolute voltage ($V_p=(V_r+V_n)$) through voltage-to-current block 1004, mixers 1020, 1022, 1024 and 1026 now receive a signal representing the desired or reference amplitude value ($V_r=(V_p-V_n)$) through voltage-to-current block ($G_r$) 1054. Another difference is that the mixer 1003 within the amplitude error predictor circuitry 1002 mixes the pre-compensated PWM signal ($T_{i+c}$) with a signal representing the ripple (or AC) component ($V_n$) of the output pulse amplitude through voltage-to-current block ($G_n$) 1001. A further difference is that the variable width block 1006 and the fixed delay block 1008 receive a signal representing the desired or reference output amplitude voltage ($V_r$) rather than the signal representing the supply or amplitude absolute voltage ($V_p$). These changes in FIG. 10B adjust the representation of the error signal ($I_{error}$) to be the following:

$$I_{error}=[V_n G_n(\tau_i+\tau_c)/T]+[V_r G_r\tau_c/T].$$

In steady state where the feedback loop forces $I_{error}=0$, the resulting pulse pre-compensation is given by:

$$\tau_c=-\tau_i(G_n/G_r)[V_n/(V_p+V_n(G_n-G_r)/G_n)],$$

which is of the desired form for perfect cancellation if $G_n=G_r$.

These changes in FIG. 10B also adjust the gain values represented above. In particular, the gain value associated with the edge phase detection in blocks 1012 and 1014 in units of volt/time is now represented by the equation:

$$K_\Phi=G_r*V_r/C_i$$

and the gain value associated with the variable width block 1006 in units of time/volt can be represented by the equation:

$$K_\tau=C_T/(G_d*V_r)$$

FIG. 10C is a block diagram for a closed loop pulse based width adjustment circuit embodiment 1070 that uses pre-compensated pulse width weighting along with a linear interpolation predictor. The embodiment 1070 in FIG. 10C is similar to the embodiment 1050 in FIG. 10B in most respects. One difference is that the embodiment 1070 modifies the voltage-to-current block ($2G_n$) 1001 to amplify the ripple (or AC) component ($V_n$) of the amplitude by twice the amount in FIG. 10B. Another difference is that a second delayed path is added from mixer 1003 to summation block 1016. In particular, a delay element ($\frac{1}{2}Z^{-1}$) 1072 is added between the output of mixer 1003 and the summation block 1016. This delay path introduces an additional negative input to summation block 1016 that represents a delayed version of the amplitude predictor output signal ($I_{ped}$). For steady state, the representation of the error signal ($I_{error}$) defaults to be the same as for embodiment 1050 in FIG. 10B. However, improved performance results because the amplitude error predictor is more accurate.

FIG. 11 is an example timing diagram 1100 for the closed loop pulse width adjustment circuitry of FIG. 10A. As depicted, signal 1102 represents an uncompensated PWM input signal ($T_i$) including a pulse 1020. Signal line 1104 represents a delayed version ($T_{i(delayed)}$) of the uncompensated PWM input signal that has been output by the fixed delay block 1008 and delayed by a fixed amount of a bias delay ($\tau_i$) 1022. The variable width block 1006 outputs a pre-compensated PWM signal ($T_{i+c}$) using the error correction signal ($V_c$). The rising edge phase detector 1012 and falling edge phase detector 1014 compare the delayed PWM input signal ($T_{i(delayed)}$) with the pre-compensated PWM signal ($T_{i+c}$) to help provide the error correction signal ($V_c$) in operation with the summation block 1016 and the low pass filter 1010.

Signal line 1106 in FIG. 11 represents a pre-compensated PWM signal ($T_{i+c}$) that is compared with the a delayed version ($T_{i(delayed)}$) of the uncompensated PWM input signal. As shown in FIG. 11, this phase comparison produces a rising edge delay ($\tau_{dr}$) 1024 between dotted lines 1112 and 1114 and produces a falling edge delay ($\tau_{df}$) 1026 between dotted lines 1116 and 1118. In particular, the signal line 1108 represents the rising-edge-down signal ($T_{down(rising)}$) from rising edge phase ($\Phi$) detector 1012 that includes a pulse 1032 having a width that provides the rising edge delay ($\tau_{dr}$) 1024. (Signal line 1108 represents the DOWN signal ($T_{down}$) sent to mixer 1020 in FIG. 10A.) The signal line 1110 represents the falling-edge-up signal ($T_{up(falling)}$) from falling edge phase ($\Phi$) detector 1014 that includes a pulse 1034 having a width that provides the falling edge delay ($\tau_{uf}$) 1026. (Signal line 1110 represents the UP signal ($T_{up}$) sent to mixer 1026 in FIG. 10A.) The rising edge delay ($\tau_{dr}$) plus the falling edge delay ($\tau_{uf}$) represents the total pre-compensation delay ($\tau_c$) applied to the uncompensated PWM signal ($T_i$). These delays are then used to produce the error correction signal ($V_c$) that is applied to the next pulse for the PWM input signal ($T_i$) to generate the pre-compensated PWM signal ($T_{i+c}$).

FIG. 12 is a block diagram for a more general embodiment 1200 for the closed loop pulse width adjustment embodiments of FIGS. 10A, 10B and 10C. The variable width block 1006 receives the PWM input signal ($T_i$) and the timing feedback error signal 1204 from the timing comparison circuitry 1202 and outputs the pre-compensated PWM signal ($T_{i+c}$). The timing comparison circuitry 1202 generates the timing feedback error signal ($I_T$) 1204 by comparing the pulse width between the PWM input signal ($T_i$) and the pre-compensated PWM signal ($T_{i+c}$) to determine a timing difference and then by weighting this timing difference with an output amplitude ($V_p$ or $V_r$). For practical implementations, a delay block 1008 may be required to provide a delayed version ($T_{i(DELAYED)}$) of the PWM input signal ($T_{i+c}$) to the timing comparison circuitry 1202. The timing feedback error signal ($I_y$) 1204 and the amplitude predictive error correction signal ($I_{pc}$) from the amplitude error predictor 1002 are provided to the summation/integrator block 1206. The summation/integrator block 1206 then outputs the error correction signal ($V_c$) to the variable width block 1006. As set forth above, the timing-based feedback error correction signal ($V_c$) is applied to the variable width block 1006 in order to set the correct amount of pulse width compensation and to compensate for residual timing errors in the pre-compensation provided by the variable width block 1006.

It is noted that the timing comparison circuitry 1202 correlates to the rising and falling edge phase (Φ) detectors 1012 and 1014 and the mixers 1020, 1022, 1024 and 1026 in FIGS. 10A-C. The summer/integrator block 1206 correlates to the summation block 1016 and the low pass filter 1010. And the timing feedback error signal ($I_y$) 1204 correlates to the combination of the output signals from mixers 1020, 1022, 1024 and 1026. Further, as also shown in FIGS. 10A-C with respect to block 1004 and 1054, the gain of the timing comparison circuitry 1202 can be proportional to either an output pulse amplitude total value ($V_p$) or an output pulse amplitude desired value ($V_r$), as desired. And the amplitude error predictor 1002 can receive the PWM input signal ($T_i$) or the pre-compensated PWM signal ($T_{i+c}$), respectively, along with the ripple or AC component ($V_n$) of the output amplitude. It is further noted that the amplitude error predictor 1002 in FIGS. 10A-C and 12 correlates to the amplitude error prediction circuitry 204 in FIGS. 2A-D, and the other circuitry in FIGS. 10A-C and 12 correlate to the width adjustment circuitry 202 in FIGS. 2A-C. In other words, the width adjustment circuitry in FIG. 12 includes the variable width circuitry 1006, the timing comparison circuitry 1202 and the summer/integrator 1206, as well as the optional delay block 1008. Advantageously, with respect to the embodiments in FIGS. 10A-C and 12, by feeding back width adjustment timing information to the pre-compensation process through the use of timing comparison circuitry 1202, closed loop width adjustment is provided in the system, and residual errors in the pre-compensation process will tend to be canceled out.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A method for pre-compensation timing feedback in switching amplifiers using predictive feedback compensation, comprising:

receiving a pulse width modulated (PWM) input signal having an input pulse width;

predicting an output pulse amplitude error for the PWM input signal based on a prior PWM output signal;

pre-compensating the input pulse width for the PWM input signal with a width adjustment to produce a pre-compensated PWM signal having a pre-compensated pulse width such that the predicted output pulse amplitude error weighted by a pulse width is forced by closed loop feedback to equal a timing difference between the pre-compensated pulse width and the input pulse width weighted by an output pulse amplitude, the width adjustment thereby being based upon a ratio of the predicted output pulse amplitude error to the output pulse amplitude weighted by the pulse width; and outputting a PWM output signal through a switching amplifier, the PWM output signal having a pulse width based upon the pre-compensated PWM signal.

2. The method of claim 1, further comprising determining the timing difference by comparing a rising edge for the pre-compensated PWM signal to a reference edge based on the PWM input signal and by comparing a falling edge for the pre-compensated PWM input signal to a reference edge based on the PWM input signal.

3. The method of claim 2, further comprising using a rising reference edge based on the PWM input signal for the rising edge comparison and using a falling reference edge based on the PWM input signal for the falling edge comparison.

4. The method of claim 2, further comprising generating a first timing feedback signal to reduce a time-of-transition or a second timing feedback signal to increase the time-of-transition for the rising edge of the pre-compensated PWM signal based upon the timing difference, and generating a third timing feedback signal to reduce a time-of-transition or a fourth timing feedback signal to increase the time-of-transition of the falling edge for the pre-compensated PWM signal based upon the timing difference.

5. The method of claim 2, wherein the pre-compensating step comprises weighting the predicted output pulse amplitude error by the input pulse width for the PWM input signal and weighting the timing difference between the pre-compensated pulse width and the input pulse width by the output pulse amplitude total value such that the width adjustment is based upon a ratio of the predicted output pulse amplitude error to the output pulse amplitude total value weighted by the input pulse width.

6. The method of claim 2, wherein the pre-compensating step comprises weighting the predicted output pulse amplitude error by the pre-compensated pulse width and weighting the timing difference between the pre-compensated pulse width and the input pulse width by the output pulse amplitude desired value such that the width adjustment is based upon a ratio of the predicted output pulse amplitude error to the output pulse amplitude desired value weighted by the pre-compensated signal pulse width.

7. The method of claim 1, wherein the predicting step comprises measuring a varying or alternating current (AC) component of a supply voltage to predict the output pulse amplitude error for the PWM input signal based on a prior PWM output signal.

8. The method of claim 1, wherein the predicting step comprises measuring a varying or alternating current (AC) component of an output pulse amplitude for the PWM output signal to predict the output pulse amplitude error for the PWM input signal based on a prior PWM output signal.

9. The method of claim 1, wherein the receiving step comprises receiving two PWM input signals, such that signal information resides in a difference between the two signals, wherein the outputting step comprises outputting two PWM output signals, and wherein the pre-compensating step comprises adjusting pulse widths for each of the two PWM input signals.

10. The method of claim 1, further comprising predicting an output pulse amplitude error associated with a single prior PWM output signal.

11. The method of claim 1, further comprising predicting an output pulse amplitude error associated with a plurality of prior PWM output signals.

12. A digital switching amplifier having pre-compensation timing feedback for predictive feedback compensation, comprising:

amplitude error prediction circuitry configured to sense a voltage representing the output pulse amplitude for a PWM output signal, to determine a predicted output pulse amplitude error for a PWM input signal using the sensed voltage, and to output a predictive error correction signal proportional to a ratio of the predicted output pulse amplitude error to an output pulse amplitude weighted by a pulse width;

width adjustment circuitry coupled to receive the predictive error correction signal and a PWM input signal having an input pulse width and configured to output a pre-compensated PWM signal having a pre-compensated pulse width based upon a width adjustment such that the predicted output pulse amplitude error weighted by a pulse width is forced by closed loop feedback to equal a timing difference between the pre-compensated PWM pulse width and the input pulse width weighted by an output pulse amplitude, the width adjustment thereby being based upon a ratio of the predicted output pulse amplitude error to the output pulse amplitude weighted by the pulse width; and switching amplifier driver circuitry configured to receive the pre-compensated PWM signal and to drive a PWM output signal.

13. The digital switching amplifier of claim 12, wherein the width adjustment circuitry comprises timing comparison circuitry configured to generate timing feedback signals based upon comparisons between the PWM input signal and the pre-compensated PWM signal, summation circuitry configured to combine the predictive error correction signal with the timing feedback signals and to provide a correction signal, and variable width circuitry configured to receive the correction signal and to output the pre-compensated PWM signal.

14. The digital switching amplifier of claim 13, wherein the timing comparison circuitry comprises edge detection circuitry configured to compare a pre-compensated pulse width for the pre-compensated PWM signal to a reference pulse width based on the PWM input signal to determine a width adjustment timing relationship between the pre-compensated PWM signal and the PWM input signal and to provide timing feedback signals based upon the width adjustment timing relationship.

15. The digital switching amplifier of claim 14, wherein the edge detection circuitry comprises rising edge detection circuitry configured to compare rising edges for the pre-compensated PWM signal to reference edges based on the PWM input signal and falling edge detection circuitry configured to compare falling edges for the pre-compensated PWM signal to reference edges based on the PWM input signal.

16. The digital switching amplifier of claim 15, wherein the rising edge detection circuitry is configured to use rising reference edges based on the PWM input signal for the rising edge comparison and wherein the falling edge detection circuitry is configured to use falling reference edges based on the PWM input signal for the falling edge comparison.

17. The digital switching amplifier of claim 15, wherein the rising edge detection circuitry is further configured to generate a first timing feedback signal to reduce a time-of-transition or a second timing feedback signal to increase the time-of-transition for the rising edge of the pre-compensated PWM signal based upon the timing difference, and to generate a third timing feedback signal to reduce a time-of-transition or a fourth timing feedback signal to increase the time-of-transition of the falling edge for the pre-compensated PWM signal based upon the timing difference.

18. The digital switching amplifier of claim 14, wherein the timing feedback signals are weighted by an output pulse amplitude total value, and wherein the width adjustment is based upon a ratio of the predicted output pulse amplitude error to the output pulse amplitude total value weighted by the input pulse width for the PWM input signal.

19. The digital switching amplifier of claim 14, wherein the timing feedback signals are weighted by an output pulse amplitude desired value, and wherein the width adjustment is based upon a ratio of the predicted output pulse amplitude error to the output pulse amplitude desired value weighted by the pre-compensated pulse width for the pre-compensated PWM signal.

20. The digital switching amplifier of claim 12, wherein the amplitude error prediction circuitry is configured to sense a varying or alternating current (AC) component of a supply voltage to predict the output pulse amplitude error for the PWM input signal based on a prior PWM output signal.

21. The digital switching amplifier of claim 12, wherein the amplitude error prediction circuitry is configured to sense a varying or alternating current (AC) component of an output pulse amplitude for the PWM output signal to predict the output pulse amplitude error for the PWM input signal based on a prior PWM output signal.

22. The digital switching amplifier of claim 12, wherein the PWM input signals comprise two PWM input signals, such that signal information resides in a difference between the two signals, the PWM output signals comprise two PWM output signals, and the width adjustment circuitry is configured to adjust pulse widths for the two PWM input signals.

23. The digital switching amplifier of claim 12, wherein the amplitude error prediction circuitry is configured to predict an output pulse amplitude error associated with a single prior PWM output signal.

24. The digital switching amplifier of claim 12, wherein the amplitude error prediction circuitry is configured to predict an output pulse amplitude error associated with a plurality of prior PWM output signals.

* * * * *